(12) United States Patent
Ino

(10) Patent No.: US 6,347,390 B1
(45) Date of Patent: Feb. 12, 2002

(54) DATA ENCODING METHOD AND DEVICE, DATA DECODING METHOD AND DEVICE, AND DATA SUPPLY MEDIUM

(75) Inventor: Hiroyuki Ino, Gunma (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/354,240

(22) Filed: Jul. 16, 1999

(30) Foreign Application Priority Data

Jul. 23, 1998 (JP) .......................................... 10-207372

(51) Int. Cl.[7] .............................................. G06F 11/00
(52) U.S. Cl. ........................ 714/792; 714/794; 714/795; 375/262; 375/265; 375/341
(58) Field of Search ................................. 714/746, 752, 714/786, 792, 794, 795; 375/262, 265, 341; 704/242, FOR 104

(56) References Cited

U.S. PATENT DOCUMENTS 5,280,489 A * 1/1994 Fredrickson et al. .......... 371/45
6,009,123 A * 12/1999 Kaku et al. .................. 375/265
6,104,758 A * 8/2000 Kaku et al. .................. 375/265

* cited by examiner

Primary Examiner—Albert Decady
Assistant Examiner—Matt Dooley
(74) Attorney, Agent, or Firm—Oblon, Spivak, McClelland, Maier & Neustadt, P.C.

(57) ABSTRACT

In encoding method and device for encoding m-bit data to an n-bit code, the n-bit code is generated according to a finite state transition diagram representing the restriction of ADS and RDS received by a code sequence; two states contained in a state assembly set as start points of the n-bit code in the finite state transition diagram exist at symmetrical positions with respect to the center point of the finite state transition diagram, at symmetrical positions with respect to the ADS axis passing through the center point of the finite state transition diagram or at the symmetrical positions with respect to the RDS axis passing the center point of the finite state transition diagram; the m-bit data are encoded to an n-bit code word having as a start point a predetermined state contained in a state assembly set as start points of the code; and an n-bit code word having as a start point another state contained in a state assembly set as start points by the code is obtained by further converting the encoded code word.

33 Claims, 12 Drawing Sheets

CONVENTIONAL ENCODER

CONVENTIONAL DECODER

FINITE STATE TRANSITION DIAGRAM

FIG. 10

CODE WORD CONVERSION TABLE

| START POINT | TYPE | INPUT | OUTPUT |
|---|---|---|---|
| 00 | x | 00 | ← |
|  |  | 01 | ← |
|  |  | 10 | ← |
|  |  | 11 | ← |
| 01 | 0 | 00 | ← |
|  |  | 01 | ← |
|  |  | 10 | ← |
|  |  | 11 | ← |
|  | 1 | 00 | INVERSION |
|  |  | 01 | ← |
|  |  | 10 | ← |
|  |  | 11 | INVERSION |
| 10 | 0 | 00 | INVERSION |
|  |  | 01 | INVERSION |
|  |  | 10 | INVERSION |
|  |  | 11 | INVERSION |
|  | 1 | 00 | ← |
|  |  | 01 | INVERSION |
|  |  | 10 | INVERSION |
|  |  | 11 | ← |
| 11 | x | 00 | INVERSION |
|  |  | 01 | INVERSION |
|  |  | 10 | INVERSION |
|  |  | 11 | INVERSION |

FIG. 11

CORRESPONDENCE BETWEEN CODE WORD AND DATA WORD

DATA ENCODING METHOD AND DEVICE, DATA DECODING METHOD AND DEVICE, AND DATA SUPPLY MEDIUM

BACKGROUND OF THE INVENTION

1. Field of the Invention

The present invention relates to data coding method and device, data decoding method and device, and data supply medium, and particularly to data coding method and device, data decoding method and device, and data supply medium which are effectively used for cases where video data, audio data or other digital data are recorded in a recording medium such as a magnetic disc, a magnetic tape, an optical disc, a magnet optical disc, a phase-variation disc or the like and these data are reproduced from the recording medium.

2. Description of the Related Art

When video data and audio data are digitally recorded or reproduced into or from a recording medium such as a magnetic disc, an optical disc, a magnet optical disc, a magnetic tape or the like, it is required that the data can be recorded in as high density as possible and with high reliability. It is known that a PRML (Partial Response signaling with Maximum Likelihood detection) system which is implemented by combining a partial response system and a maximum likelihood decoding (detection) system is preferably used in order to satisfy the above requirement. According to PRML, data can be recorded in higher density and with higher reliability. In general, a partial response (1,1) or a partial response (1,0,-1) is used for the recording of digital data, and Viterbi decoding (Viterbi detection) is usually used for the maximum likelihood detection system.

There has been known a technique in which by combining the partial response system with the coding technique, the squared free euclidean distance $d^2_{free}$ is increased and SNR (Signal to Noise Ratio) is enhanced on the output of a partial response channel, whereby data can be recorded in high density and with high reliability. This technique is called as TCPR (Trellis Coded Partial Response), and a code produced by this technique is called as a Trellis code.

Here, the squared free euclidean distance $d^2_{free}$ is the minimum euclidean distance between two different paths which start from a common state and end to a common state on a Trellis diagram representing the output sequence of the partial response channel (hereinafter referred to as Detector Trellis. The Viterbi detection is carried out on the basis of the Detector Trellis). The starting and ending states may be different from each other.

For example, in the partial response (1,0,-1) (hereinafter abbreviated as PR4), if $d^2_{free}$ of the conventional bit-by-bit detection system is set to 1, $d^2_{free}$ can be set to 2 by performing the Viterbi detection (PR4ML). Here, PR4ML means a combination system of PR4 and the maximum likelihood decoding (Viterbi detection). SNR can be more enhanced as the value of $d^2_{free}$ is increased, and it means that the recording can be performed in higher density and with higher reliability. Further, with respect to PR4, a practical Trellis code which sets $d^2_{free}$ to 4 is known (TCPR4). Here, TCPR4 is a combination system of PR4 and the Trellis code.

There is known a theory in which the value of $d^2_{free}$ can be increased by making coincidence between the null point of power density of codes and the null point of the transfer function of a transfer path, and the Trelllis code formed on the basis of the theory is called as MSN (Matched Spectral Null) code.

For example, in PR4, the transfer function becomes null at a DC component and a frequency component (so-called Nyquist frequency) of a half of a recording rate (1/$T_c$, $T_c$ represents the time width (bit period) of one code bit). Accordingly, $d^2_{free}$ can be increased by making one or both of the DC component of the code and the Nyquist frequency null.

Further, for example, in the partial response (1,1) (hereinafter abbreviated as PR1), the transfer function is null at the Nyquist frequency component. Accordingly, $d^2_{free}$ can be increased by making null the Nyquist frequency component of the power density of the code.

Here, symbols "+1" and "−1" are allocated to code bits "1" and "0" respectively, and the sum of all the symbols from a symbol at a start time point (start point) or an infinite past of a code sequence to a symbol at the current time point, that is, RDS (Running Digital Sum) is an index for estimating the above DC component. If RDS is limited to a value within a fixed range, it means that the DC component of the power density of the code becomes null.

As in the case of RDS, the sum of all the values obtained by multiplying the symbol "+1" or "−1" allocated to a code bit by "−1" every other bit from a start time point or infinite past to the current time point, that is, ADS (Alternating Digital Sum) is an index for estimating the Nyquist frequency component as described above. If ADS is limited to a value within a fixed range, it means that the Nyquist frequency component of the power density of the code becomes null.

When the transfer function has a DC component like PR1, it is generally required to make the DC component of the power density of the code null. That is, it is required to prevent a DC component from being contained in a code which is a recording signal, for example in order to prevent occurrence of an error due to fluctuation of a reference level when a code is detected from a reproduction signal by the Viterbi detection in magnetic recording/reproduction having differential characteristics in a reproducing system, and in order to prevent occurrence of variation of various error signals such as a tracking error signal, etc. in servo control of a disc device in recording/reproduction of an optical disc or a magnet optical disc.

Therefore, in 8/10 conversion code (Rate 8/10 code) adopted in digital audio tape recorders (DAT), DSV (Digital Sum Variation) which is the amplitude value of RDS (the maximum value of RDS—Minimum value of RDS) is made infinite so that the power density of the code has no DC component, and also DSV is reduced to as small a value as possible. Here, the smaller DSV is, the more the low frequency band component of the power density of the code is suppressed. The code which is subjected to DSV control is called as "DS free code".

In EFM (Eight-to-Fourteen Modulation) used for compact disc (CD) players, although the complete DC free coding is not performed, the control is performed so that DSV is reduced as much as possible in order to suppress the low frequency band component of the power density thereof.

Further, in the case where the PRML system is applied, there occurs a problem in length of a path memory for the Viterbi detection operation. The path memory is a storage device for storing a temporary judgment value of the detection until the Viterbi detection result is settled, and it needs a length (storage capacity) proportional to the time interval until the detection result (decoding result) is settled.

The time interval until the Viterbi detection result is settled, that is, the length of the path memory is normally controlled by constructing codes so that the Quasi-Catastrophic sequence (hereinafter referred to as "QC sequence") is nullified and also the maximum length of the minimum-distance error events is shortened as much as possible.

Here, the minimum-distance error events generally indicate error events caused by a sequence making $d^2_{free}$ on detector Trellis. The QC sequence means two or more different paths whose squared euclidean distances are not accumulated on the Trellis diagram and thus exist (continue) infinitely. For example, when paths having state transitions of 111 . . . , 333 . . . , 555 . . . respectively on the Trellis diagram continue infinitely for a code sequence 101010 . . . , these three paths are called as QC sequences. Since the distance between the respective paths is not accumulated at any time and thus equal to zero, it cannot be judged which QC sequence of these sequences is right, that is, the path cannot be settled. Therefore, when a QC sequence occurs, the result of Viterbi detection cannot be settled.

When a device for performing the Viterbi detection is actually implemented, it is impossible to have a path memory having an infinite capacity, and also it is required from the viewpoint of cost, the size of occupation space (device scale), power consumption, etc. that the device has as short a path memory as possible. Therefore, the following manner of nullifying the QC sequence has been proposed.

That is, for example when the 8/10 code is applied to PR1, the QC sequence can be nullifying by restricting one continuous number of a data sequence before NRZI (Non Return to Zero Inverted).

Besides, so-called $T_{min}$ (the minimum continuous length of the same symbol) and $T_{max}$ (the maximum continuous length of the same symbol) of a code which is a recording signal is important as an index for estimating the performance of the code, and it is preferable that $T_{max}$ is as small as possible.

That is, for example, in the magnetic recording/reproduction, as $T_{max}$ is large, a problem occurs in deletion rate in an overwrite operation. Further, when an azimuth recording operation is carried out, cross talk from an adjacent track is intensified to deteriorate the quality of reproduced data. With respect to PLL (Phase Locked Loop), as $T_{max}$ is large, the amount of information to establish synchronization is reduced to cause malfunction.

In the above combination with PR4, an MSN code (Sectioned-MSN code) of 8/10 rate based on a method called as partitioning as one of MSN codes setting $d^2_{free}$ to 4 has been proposed in L. Fredrickson, R. Karabed, J. Rae, P. Siegel, H. Thapar and R. Wood, "Improved Trellis-Coding for Partial-Response Channels", IEEE Transaction on Magnetics, Vol. 31, No. 2, March 1995, pp.1141–1148. The length of the path memory of this code can be shortened to a smaller value as compared with MSN codes of 8/10 rate which have been hitherto reported, for example, in U.S. Pat. No. 5,095,484 or H. Thapar, J. Rac, C. Shung, R. Karabed and P. Siegel, "On the performance of a Rate 8/10 Matched Spectral Null Code for Class-4 Partial response", IEEE Transaction on Magnetics, Vol. 28, No. 5, September 1992, pp. 2883–2888.

Comparing PR1 and PR4, the transfer function of a high frequency band is more suppressed in PR1 than PR4, and thus emphasis of a high frequency band noise is reduced. Therefore, PR1 is more effective to high line densification. This has been already reported in H. Ino and Y. Shipuku, "8/10 PR1ML for High Density and High Rate Tape Strage Systems", IEEE Transaction on Magnetics, Vol. 31, No. 6, November 1995, pp.3036–3038, H. Ino, S. Higashino, and Y. Shinpuku, "Performance of Trellis-Coded Class-1 Partial response", IEEE Transaction on Magnetics, Vol. 33, No. 5, September 1997, pp.2752–2754, etc.

The applicant of this application previously proposed a 16/20 MSN code which is a Trellis code having a conversion efficiency (coding rate) of 4/5 and aims to be applied to PR1 and further a partial response in which the transfer function has a null point at the Nyquist frequency (Japanese Laid-open patent Application No. Hei-9-64231). The power density of this code becomes null at the Nyquist frequency, and further it is null even in the case of direct current (DC). When this code is applied to PR1 (TCPR1), assuming that $d^2_{free}$ when no coding is carried out is equal to 2, $d^2_{free}$ can be set to 4. The maximum length of the minimum-distance error event is equal to 5 code length (one code length is equal to 20 bits), and the maximum continuous length of the same symbol is equal to 10.

In this case, the maximum length of the minimum-distance error event is equal to 5 code length, and thus the required length of the path memory is equal to about 5 code length. However, from the viewpoint of the scale, cost, etc. of the hardware, the length of the path memory is required to be further shortened.

The code after a Partitioned-MSN code which aims to be applied to PR4 is interleaved can be applied to not only PR4, but also PR1. This is because the power density of the code after the interleave is null not only in the case of DC, but also at the Nyquist frequency thereof, and further a mechanism for preventing occurrence of the QC sequence is applied to TCPR 1. Since the DC component of the power density is null, the code is a DC free code, and also since the Nyquist frequency component is null, $d^2_{free}$ can be set to 4 for even TCPR1. Further, when the Partitioned-MSN code is applied, GTD (Generalized Truncation Depth) is equal to 40 bits, and it is extremely smaller than the 5 code length (100 bits) in the above 16/20 MSN code.

Here, GTD means the maximum length of the squared euclidean distance of pairs of paths which start from every common state as a start point until the squared euclidean distance reaches the squared free euclidean distance $d^2_{free}$ (for example, 4 for the above Partitioned-MSN code). Wherein of these pairs of the paths starting from the common states, at least one of each pair is assumed to be a code sequence. GTD is used when the detector Trellis is timely varied, and it is used as an index indicating the needed length of the path memory as in the case of the maximum length of the minimum-distance error event.

However, in the case of TCPR1 based on the Partitioned-MSN code, if the same method as TCPR4, that is, the method described in L. Fredrickson, R. Karabed, J. Rae, P. Siegel, H. Thapar and R. Wood, "Improved Trellis-coding for Partial-Response Channels", IEEE Transactionon Magnetics, Vol. 31, No. 2, March 1995, pp 1141–1148 is used in the detection operation, there has been a problem that an extra state transition which does not correspond to the code sequence is unintentionally contained in the detector Trellis of TCPR1, and a part of it becomes a QC sequence.

Therefore, the applicant of this application previously proposed a method of effectively nullifying the QC sequence from the detector Trellis when the Partitioned-MSN code is applied to a partial response whose transfer function has a null point at the Nyquist frequency, in Japanese Laid-open Patent Application No. Hei-8-329376 or H. Ino, S. Higashino, and Y. Shinpuku, "Performance of Trellis-Coded Class-1 Partial Response", IEEE Transaction on Magnetics, Vol. 33, No. 5, September 1997, pp. 2752–2754 described above. The maximum continuous length of the same symbol of the Partitioned-MSN code described above is set to 10.

However, the above method has problems that it needs additive processing of removing the QC sequence from the detector Trellis, and this disturbs the high-speed processing of the Viterbi detector. Further, it is preferable that the maximum continuous length of the same symbol of the Partitioned-MSN code is as small as possible.

FIG. 1 shows the construction of a conventional encoder.

First, a 16-bit data word is input to an encoding circuit 101. The encoding circuit 101 is designed to associate the 16-bit data word to a 20-bit code word, and it serves to convert the input data word to the code word. A register 102 stores the state of the end point in a state transition diagram to generate the code word. The output of the register 102 is fed back to the encoding circuit 101, and the encoding circuit 101 generates a code word on the basis of the data word and the state of the end point in a previous code word. The 20-bit code word and the state of the end point of the code word are supplied to a parallel/serial converter 103, and the parallel/serial converter 103 converts the supplied data to serial data and outputs the serial data thus converted.

FIG. 2 shows the construction of a conventional decoder. When a 20-bit code word is input, a decoding circuit 111 converts the 20-bit code word thus input to a 16-bit data word and outputs the 16-bit data word thus converted.

However, in the encoder of FIG. 1, the present code word cannot be generated unless the state of the end point in the previous code word is settled, so that the processing speed of the encoder cannot be enhanced.

SUMMARY OF THE INVENTION

The present invention has been implemented in view of such a situation, and has an object to enable enhancement of the processing speed of an encoder for generating an MSN code which is applicable to a partial response whose transfer polynomial has a null point at the Nyquist frequency.

Further, the present invention has another object to supply an MSN code in which the maximum continuous length of the same symbol is small.

According to an aspect of the present invention, there is provided with an encoding method for encoding m-bit data to an n-bit code, which is characterized in that: the n-bit code is generated according to a finite state transition diagram representing the restriction of ADS and RDS received by a code sequence; two states contained in a state assembly set as start points of the n-bit code in the finite state transition diagram exist at symmetrical positions with respect to the center point of the finite state transition diagram, at symmetrical positions with respect to the ADS axis passing through the center point of the finite state transition diagram or at the symmetrical positions with respect to the RDS axis passing the center point of the finite state transition diagram; the m-bit data are encoded to an n-bit code word having as a start point a predetermined state contained in a state assembly set as start points of the code; and an n-bit code word having as a start point another state contained in a state assembly set as start points by the code is obtained by further converting the encoded code word.

According to another aspect of the present invention, there is provided an encoding device for encoding m-bit data to an n-bit code, characterized by comprising: encoding means for converting an input m-bit data word to an n-bit code word having as a start point a predetermined state contained in a state assembly set as start points of the code; code word examining means for examining the state of the end point (end-state) of a code word and the type of the code word on the basis of the code word supplied from the encoding means; end point state converting means for converting the state of the end point supplied from the code word examining means to the state of the end point output from the code word converting means; storing means for storing the end-point state output from the end-point state converting means by the amount corresponding to one code word, and outputting the state of the start point of a code word which will be next output from the code word converting means; and code word converting means for converting an n-bit code word having as a start point a predetermined state contained in a state assembly set as start points by the code supplied from the encoding means to an n-bit code word having as a start point another state contained in a state assembly set as start points of the code.

According to further aspect of the present invention, there is provided a decoding method for decoding an n-bit code to m-bit data, characterized in that: the n-bit code is generated according to a finite state transition diagram representing the restriction of ADS and RDS received by a code sequence; two states contained in a state assembly set as start points of the n-bit code in the finite state transition diagram exist at symmetrical positions with respect to the center point of the finite state transition diagram, at symmetrical positions with respect to the ADS axis passing through the center point of the finite state transition diagram or at the symmetrical positions with respect to the RDS axis passing the center point of the finite state transition diagram; an n-bit code word having as a start point any state contained in a state assembly set as start points of the code is converted to another n-bit code word having as a start point a predetermined state contained in a state assembly set as start points of the code; and the m-bit data word is obtained by decoding the converted code word.

According to a yet further aspect of the present invention, there is provided a decoding device for decoding an n-bit code to m-bit data, characterized by comprising: code word examining means for examining the state of a start point of an input n-bit code word and the type thereof; code word converting means for converting an n-bit code word having as a start point any state contained in a state assembly set as start points of the input code to another n-bit code word having as a start point a predetermined state contained in a state assembly set as start points of the code; and decoding means for decoding a code word converted by the code word converting means to the m-bit data word.

According to a still further aspect of the present invention, there is provided a supply medium in which an n-bit code obtained by encoding m-bit data is recorded, characterized in that the n-bit code is generated according to a finite state transition diagram representing the restriction of ADS and RDS received by a code sequence; two states contained in a state assembly set as start points of the n-bit code in the finite state transition diagram exist at symmetrical positions with respect to the center point of the finite state transition diagram, at symmetrical positions with respect to the ADS axis passing through the center point of the finite state transition diagram, or at the symmetrical positions with respect to the RDS axis passing the center point of the finite state transition diagram.

BRIEF DESCRIPTION OF THE DRAWINGS

FIG. 10 is a conversion table of code words which is carried out in the code word conversion circuit 22;

FIG. 11 is a diagram showing the association between the data word and the code word when a start point encoded in the encoding circuit 21 is a state (3,3);

FIG. 12 is a subsequent diagram of FIG. 11;

DETAILED DESCRIPTION OF THE PREFERRED EMBODIMENTS

Preferred embodiments according to the present invention will be described hereunder with reference to the accompanying drawings.

Figure 1:
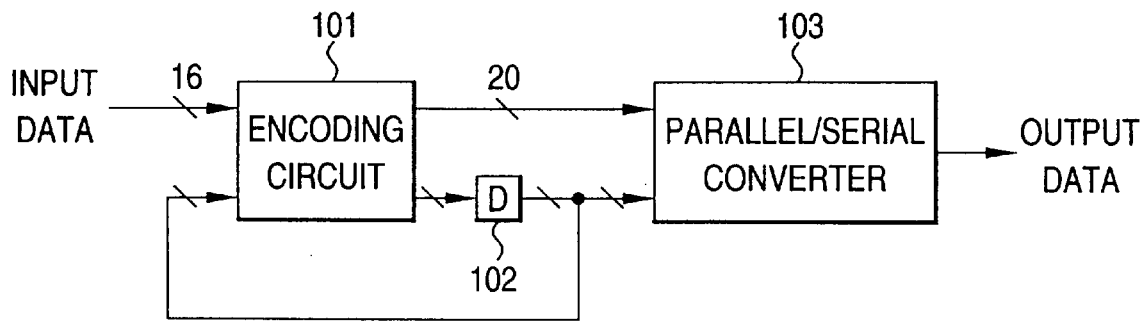
FIG. 1 is a diagram showing a conventional encoder.
Figure 2:
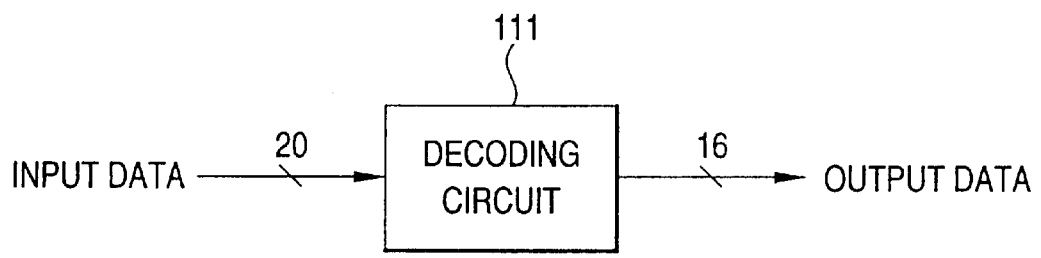
FIG. 2 is a diagram showing a conventional decoder.
Figure 3:
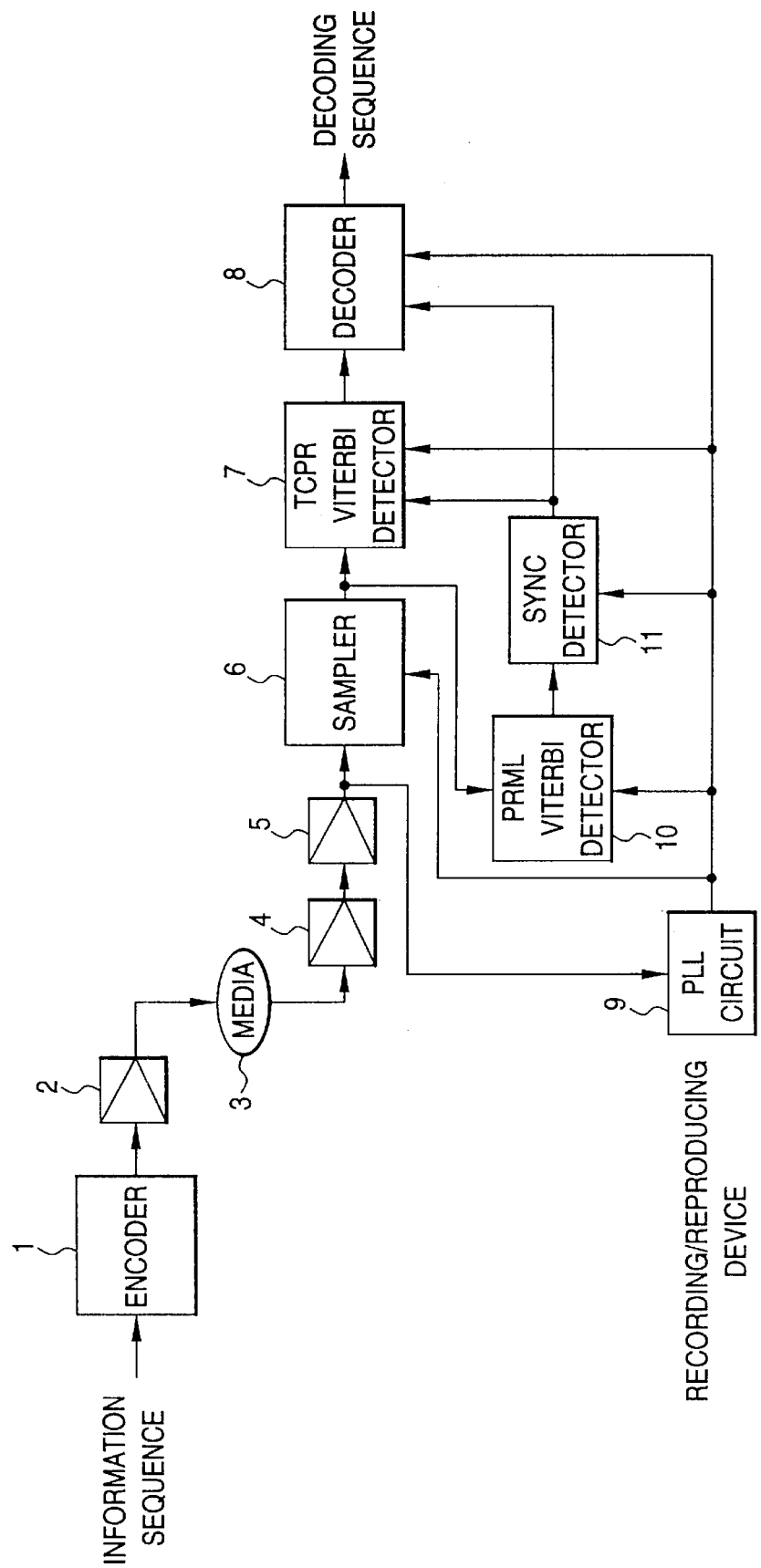
FIG. 3 is a block diagram showing the construction of a first embodiment of a recording/reproducing device to which an encoding method and a decoding method according to the present invention are applied.

FIG. 3 is a block diagram showing the construction of a first embodiment of a recording/reproducing device to which the present invention is applied.

Figure 4:
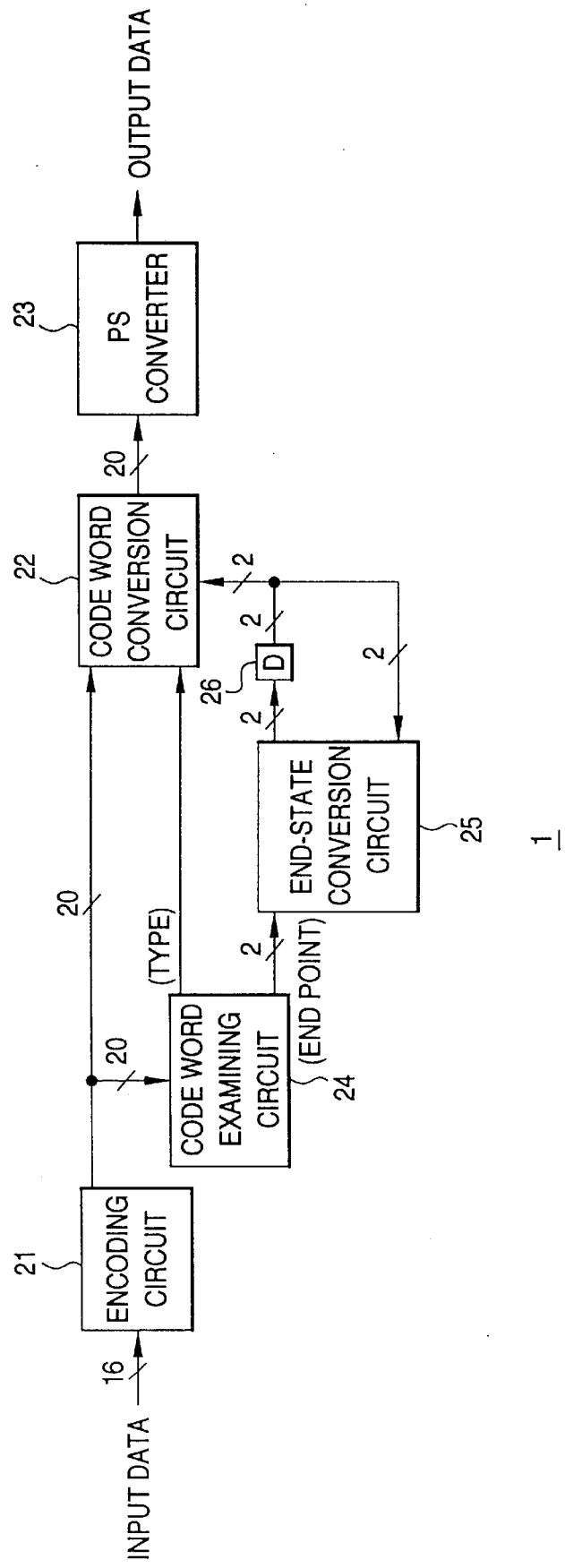
FIG. 4 is a block diagram showing the construction of a encoder 1 of FIG. 3.

As shown in FIG. 4, an encoder 1 comprises an encoding circuit 21 for converting a 16-bit data word to a 20-bit code word, a code word conversion circuit 22 for converting the code word output from the encoding circuit 21 to another code word, a parallel/serial (P/S) converter 23 for converting parallel data output from the code word conversion circuit 22 to serial data, a code word examining circuit 24 for examining the state of the end point (end-state) of a code word output from the encoding circuit 21 and the type of the code word, an end-state conversion circuit 25 for converting the state of the end point of the code word output from the encoding circuit 21 to the state of the end point of the code word output from the code word conversion circuit 22, and a register 26 for storing the state of the end point output from the end-state conversion circuit 25 by the amount corresponding to one code word, and outputting the state of a start point of a code word which will be next output from the code word conversion circuit 22.

The encoder 1 is designed to be supplied with an information sequence (binary data) such as video data, audio data or other data every 16 bits, and the information sequence will be recorded on a media 3 such as an optical disc, a magnet optical disc, a magnetic disc, a magnetic tape, a phase-variation disc or the like. The encoder 1 converts (encodes) the data word of 16-bit to a word code having a code length of 20 bits, and outputs the data word thus encoded to a recording amplifier (REC.Amp) 2. The recording amplifier 2 amplifies a code sequence as serial data output from the encoder 1, and records it in the media 3.

A reproduction amplifier (PB.Amp) 4 amplifies the reproduction signal from the media 3, and supplies it to an equalizer amplifier (EQ.Amp) 5. The equalizer amplifier 5 subjects the reproduction signal from the reproduction amplifier 4 to wave equalization, and supplies it to both of a sampler 6 and a PLL circuit 9. The sampler 6 samples the reproduction signal from the equalizer amplifier 5 according to clocks from the PLL circuit 9, and outputs the sampling value thus obtained to a TCPR Viterbi detector 7 and a PRML Viterbi detector 10. The TCPR Viterbi detector 7 detects (Viterbi decoding) the code sequence from the sampling value supplied from the sampler 6, and supplies the detection result (Viterbi decoding result) to the decoder 8.

Figure 5:
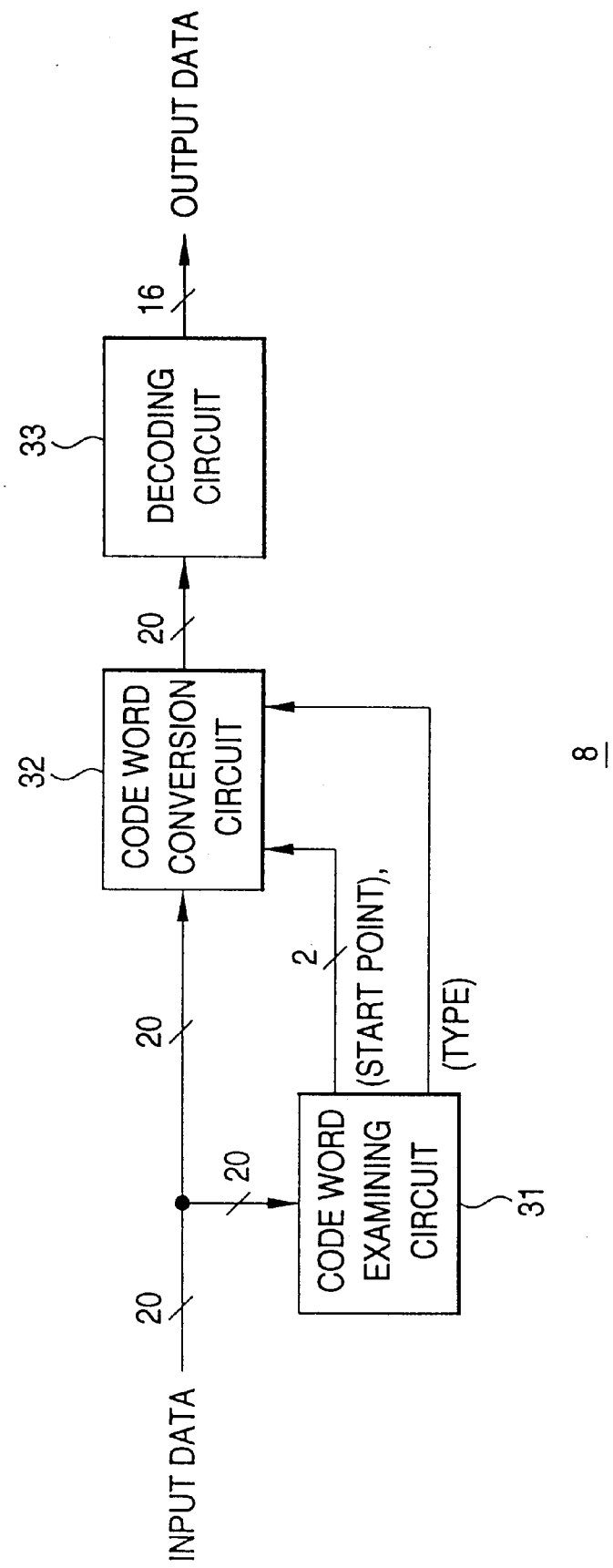
FIG. 5 is a block diagram showing the construction of a decoder 8 of FIG. 3.

As shown in FIG. 5, the decoder 8 comprises a code word examining circuit 31 for examining a state set as a start point of the input code word and the type of the code word, a code word conversion circuit 32 for converting the input code word to another code word on the basis of the output of the code word examining circuit 31, and a decoding circuit 33 for decoding the code word thus converted, thereby decoding the 20-bit code word to the original 16-bit data word.

The PLL circuit 9 generates the clocks on the basis of the reproduction signal from the equalizer amplifier 5, and outputs the clocks thus generated to the sampler 6, the TCPR Viterbi detector 7, the decoder 8, the PRML Viterbi detector 10 and a SYNC detector 11. The sampler 6, the TCPR Viterbi detector 7, the decoder 8, the PRMP Viterbi detector 10 and a SYNC detector 11 are operated according to the clocks from the PLL circuit 9.

The PRML Viterbi detector 10 detects (Viterbi-decodes) the code sequence from the sample value supplied from the sampler 6, and supplies the detection result (Viterbi decoding result) to the SYNC detector 11.

The SYNC detector 11 detects a SYNC pattern (symbol synchronous pattern) from the code sequence supplied from the PRML Viterbi detector 10, and supplies the detection result to the TCPR Viterbi detector 7 and the decoder 8.

Next, the operation thereof will be described.

A 16-bit data word input to the encoder 1 are converted to a 20-bit code word on the basis of the association relationship between a predetermined data word and a code word. The values of ADS and RDS which can be taken by the code word must satisfy seven constraints as described later.

A constraint 1 to the code word sets "the maximum amplitude (maximum variation width) of ADS of the code sequence (a sequence of code words) must be 10, and the maximum amplitude (maximum variation width) of RDS must be equal to 10.

Since the constraint 1 to the above code word makes the maximum amplitude of ADS and RDS of the code sequence infinite, if a code is designed on the basis of this constraint, the power density of this code becomes null at the Nyquist frequency and in the case of DC. That is, there can be designed an MSN code to a partial response whose transfer function has a null point at the Nyquist frequency or in the case of DC.

For example, in the case where a code based on the constraint 1 to the code word is applied to PR1 whose transfer function has a null point at the Nyquist frequency, assuming that $d^2_{free}$ when no coding is performed is equal to 2, $d^2_{free}$ can be set to 4. Further, this code is DC-free. The DSV thereof is equal to or less than 10 and the maximum continuous length of the same symbol is equal to or less than 10.

Figure 6:
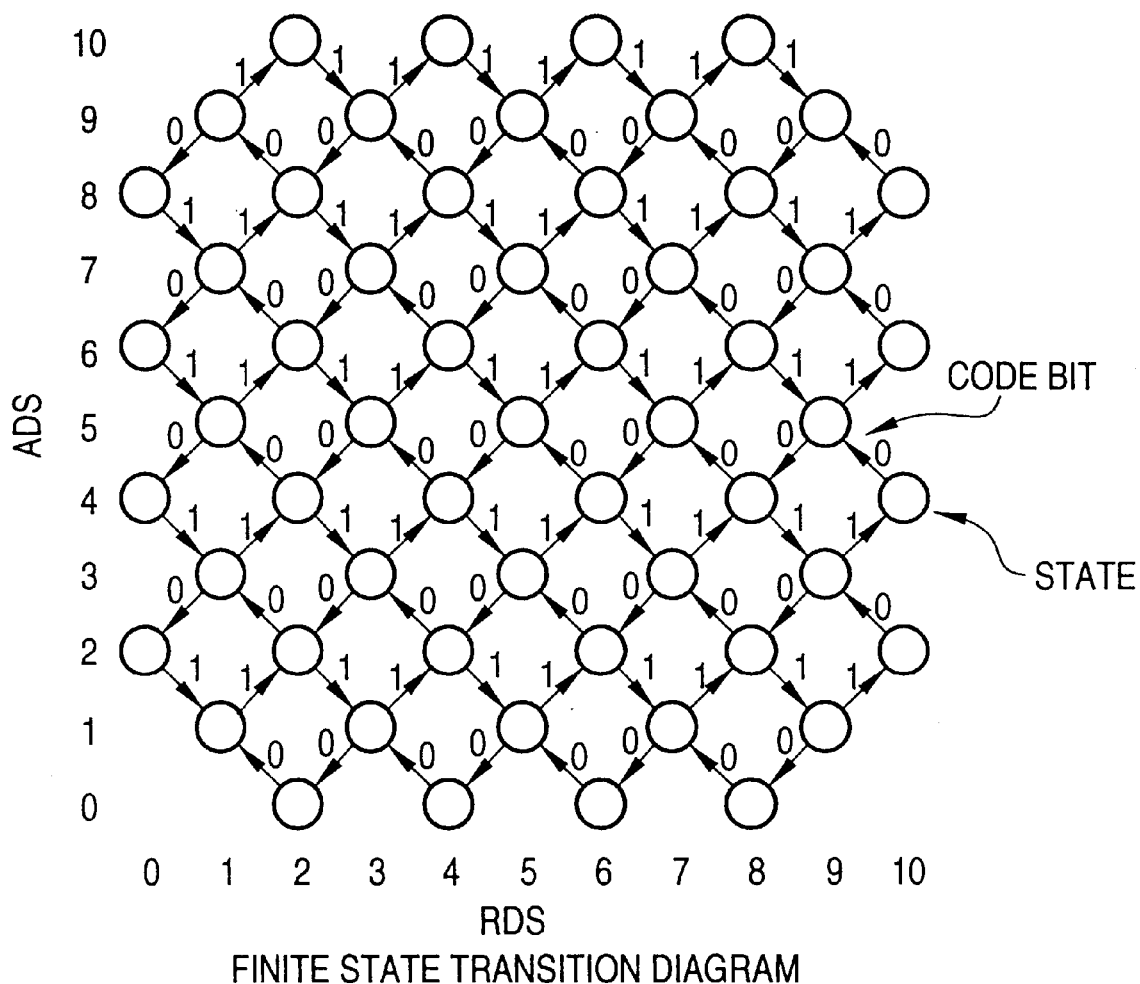
FIG. 6 is an infinite state transition diagram.

FIG. 6 is a finite state transition diagram (FSTD (Finite-State Transition Diagram)) showing the constraint of ADS and RDS which must be satisfied by the code sequence. The code word encoded in the encoder 1 is selected from a path comprising 20-times state transitions based on FSTD (a sequence of state transitions).

Next, in order to select a 20-bit code word specifically, a further required constraint is added to the state of FIG. 6. First, selection of states which the code word has as start points (start states) is performed. In FIG. 6, there may be considered many methods of selecting the states serving as the start points of the code word. In this case, the start points are selected according to the following three constraints to the start-state selection (the start-state constraints A to C).

The constraint A to the start-state selection sets: when plural elements are contained in an assembly of the states selected as start points, two states contained in the assembly satisfy (1) any one of the following conditions: the states exist at symmetrical positions with respect to the center point of FSTD (in FIG. 6, a state (5,5)); the states exist at symmetrical positions with respect to the ADS axis passing the center point of FSTD (in FIG. 6, an axis having RDS=5); and the states exist at symmetrical positions with respect to the RDS axis passing through the center point of FSTD (in FIG. 6, an axis having ADS=5), or (2) anyone of the following conditions: the two sates exist at symmetrical positions with respect to the center point of FSTD; the states exist at symmetrical positions with respect to an axis having ADS=RDS; and the states exist at symmetrical positions with respect to an axis perpendicular to the axis having ADS=RDS. Here, the state is represented by (ADS,RDS).

The constraint B to the start-state selection sets: "when elements contained in the assembly of states selected as start points are set as start points, the state assembly must be set so that all the elements are able to be end points of codewords",.

The constraint C to the start-state selection sets: "the number of different paths from each element contained in the assembly of states selected as starting points to all the elements contained in the assembly must satisfy the needed number of code words. When elements having different ADS values are contained in the assembly of states selected as start points, the number of paths after the above partitioning processing is carried out must satisfy the needed number of code words".

The start-state selection constraint A facilitates exchange between codes having different states as start points.

From a code word having as a start point any one state of the constraint A to the start point selection, a code word having the remaining states as start points can be easily generated (the details will be described). The number of start-states which are conformed with the start-state selection constraint A is equal to 4 at maximum.

In this embodiment, the maximum amplitude of each of ADS and RDS is set to 10. In FIG. 6, the center point of FSTD is the state (5,5). In general, when the maximum amplitude of each of ADS and RDS is an even number, FSTD representing the limitations of ADS and RDS has a symmetrical structure with respect to the center point thereof. However, when the maximum amplitude of one or both of ADS and RDS is an odd number, the symmetry thereof is broken (in this case, no center state of FSTD exists). This is easily confirmed by drawing FSTD. The exchange between codes having different states as start points is actually carried out by using symmetry of FSTD, and thus if the symmetry structure is broken, waste occurs in the exchange between codes. Therefore, the maximum amplitude of each of ADS and RDS is set to an even number.

The reason why the start-state selection constraint A is provided is to facilitate the exchange between codes having different states as start points. This has the following two merits. One merit is that the circuit scale of the encoder 1 and the decoder 8 can be reduced. This is because it is sufficient to provide only a code having one state as a start point with a corresponding table for converting a data word to a code word in the encoder 1 and provided only a code having one state as a start point with a corresponding table for converting a code word to a data word in the decoder. For example, in the conventional encoder must be stored a corresponding table of codes having as start points all the elements contained in the assembly of states selected as start points. However, in FIG. 4, in the encoding circuit 21 may be stored only a conversion table of a code having as a start point a state contained in the assembly of states selected as start points. Codes having the other states as start points are generated by the code word conversion circuit 22. The code word conversion circuit 22, the code word examining circuit 24 and the end point state conversion circuit 25 which are newly added perform only simple processing and the circuit scale thereof is small.

The other merit is that the operation speed of the encoder 1 can be enhanced. In general, a portion constructing a loop in the device determines the operation speed of the device. As the processing in the loop is more complicated, the operation speed of the device is more reduced. In FIG. 4, there exists a loop extending from the output of the register 26 through the end-state conversion circuit 25 to the input of the register 26, and in the loop the processing of the end-state conversion circuit 25 is simple, so that the encoder 1 can be operated at higher speed.

The start-state selection constraint B will be described. The states of FIG. 6 are classified into the following four assemblies ($S_0$ to $S_3$).

$S_0$={(1,1), (1,5), (1,9), (3,3),(3,7), (5,1), (5,5), (5,9), (7,3), (7,7), (9,1), (9,5), (9,9)}

$S_1$={(0,4), (0,8), (2,2), (2,6), (2,10), (4,0), (4,4), (4,8), (6,2), (6,6), (6,10), (8,0), (8,4), (8,8), (10,2), (10,6)}

$S_2$={(1,3), (1,7), (3,1), (3,5), (3,9), (5,3), (5,7), (7,1), (7,5), (7,9), (9,3), (9,7)}

$S_3$={(0,2), (0,6), (2,0), (2,4), (2,8), (4,2), (4,6), (4,10), (6,0), (6,4), (6,8), (8,2), (8,6), (8,10), (10,0), (10,4), (10,8)}

No common element exists among the above four assemblies. Here, there is considered a state transition when any state contained in the assembly $S_0$ is set as a starting point. In this case, the state transits to any state contained in the assembly $S_1$ at time 1, transits to any state contained in the assembly $S_2$ at time 2, transits to any state contained in the assembly $S_3$ at time 3, and returns to any state contained in the assembly $S_0$ at time 4 again. Thereafter, the following state transition: $S_0 \rightarrow S_1 \rightarrow S_2 \rightarrow S_3 \rightarrow S_0$ is repeated. The time 0 represents a time at which the code word takes a start point. The time at which the 20-bit code word takes an end point is 20, and the time 20 of the current code word is coincident with the time 0 at which a next code word takes a start point.

As described above, in FSTD representing the constraints of ADS and RDS, the states can be classified into tour assemblies having no common element, and the state transits among these four assemblies at four-time period. In this embodiment, the code length of the code is equal to 20 bits (multiple of 4), and thus when a state contained in the assembly $S_0$ is selected as a start point, the state of the end point is contained in the assembly $S_0$ again.

Next, there is considered a case where both of a state contained in the assembly $S_0$ and a state contained in the assembly en are selected as start points. Assuming that a state contained in the assembly $S_0$ is set as a start point as an initial value of the encoding, the end point of the first code word becomes a state contained in the assembly $S_0$. The start point of the next code word must be this state, so that only the states contained in the assembly $S_0$ are used as the start point and the end point of the code word. This indicates that it makes nothing to select the states contained in the assembly $S_1$ as the start and end points. Further, assuming that a state contained in the assembly $S_1$ is set to a start point as an initial value of the encoding, it also indicates that it makes nothing to select the states contained in the assembly $S_0$. Accordingly, the state to be set as a start point must be selected from any one of the assemblies $S_0$ to $S_3$.

Next, the start-state selection constraint C will be described. This constraint is natural. This is because if the number of paths is insufficient, word codes to be associated with some data words are lost, so that it is impossible to perform the encoding operation. In this embodiment, the number of different paths needed from one state serving as a start point to all states serving as end points is equal to $2^{16}$. Basically, as the state serving as the start point is nearer to the center point of FSTD, the number of paths extending from the state concerned to all the states serving as the end points is larger. Further, the number of paths is dependent on the number of selected states serving as end points, and the number of paths is larger as the number of states serving as end points is larger.

Next, selection examples satisfying the constraints A and B of the above start-state selection constraints A to C are listed up and it is checked whether the selection examples satisfy the constraint C.

The selection example 1 corresponds to a case where the state (5,5) is selected as a start point. The state (5,5) is the center point of FTSD shown in FIG. 6, and the largest number of code words can be set if one state is selected as a start point. However, upon examining the number of code words which can be taken from the state (5,5), it is equal to 55404 and this means that the selection example 1 does not satisfy the constraint C.

The selection example 2 corresponds to a case where a state (5,3) and a state (5,7) are selected as start points. The number of code words having the state (5,3) as a start point and the state (5,3) or (5,7) as an end point is equal to 83025, and the number of code words having the state (5,7) as a start point and the state (5,3) or (5,7) as an end point is equal to 83025. Accordingly, the state (5,3) and the state (5,7) are potentially usable as start points of the code words. A state (5,1) and a state (5,9) similar to the state (5,3) and the state (5,7) direct to be far away from the center point of FSTD, and thus the number of code words as candidates is reduced. The number of code words which is actually examined is equal to 27783, and this does not satisfy the constraint C.

The selection example 3 corresponds to a case where a sate (3,5) and a state (7,5) are selected as starting points. The number of code words having the state (3,5) as a start point and the state (3,5) or (7,5) as an end point is equal to 57375, and this does not satisfy the constraint C.

The selection example 4 corresponds to a case where a state (4,4) and a state (6,6) are selected as start points. The number of code words having the state (4,4) as a start point and the state (4,4) or (6,6) as an end point is equal to 57834, and this does not satisfy the constraint C.

When two states are selected as a start point and an end point, the selection examples other than the selection examples 2 to 4 are farther away from the center point of FSTD, and thus it is apparent from these selection examples do not satisfy the constraint C.

The selection example corresponds to a case where a state (3,3), a state (3,7), a state (7,3) and a state (7,7) are selected as start points. The number of code words having the state (3,3) or (7,7) as a start point and any one of the states (3,3), (3,7), (7,3) and (7,7) as an end point is equal to 88992, and this satisfies the constraint C. The number of code words having the state (3,7) or (7,3) as a start point and any one of the states (3,3), (3,7), (7,3) and (7,7) as an end point is equal to 82944, and this satisfies the constraint C.

The selection example 6 corresponds to a case where the state (3,5), the state (5,3), the state (5,7) and the state (7,5) are selected as start points. The number of code words having the state (5,3) or (5,7) as a start point and any one of the states (3,5), (5,3), (5,7) and (7,5) as an end point is equal to 111051, and this satisfies the constraint C. On the other hand, the number of code words having the state (3,5) or (7,5) as a start point and any one of the states (3,5), (5,3), (5,7) and (7,5) as an end point is equal to 50814, and this does not satisfies the constraint C.

When four states are selected as start and end points, the selection examples other than the selection examples 5 and 6 are farther away from the center point of FSTD, and thus the number of word codes is reduced. Upon an actual examination, the selection examples other than the selection example 5 do not satisfy the constraint C.

In addition to the above selection examples 1 to 6, there may be considered a selection example in which three states are selected as start points, however, this selection example will not be described because it has no merit.

Accordingly, the selection examples 2 and 5 satisfy the start-state selection constraints A to C. The selection example 2 provides the largest number of code words in the selection examples for which no partitioning operation is needed, and the selection example 5 provides the largest number of code words in all the selection examples. In this embodiment, the selection example 5 which provides the largest number of code words is used to select a start point.

That is, the constraint 2 to the code word "in FSTD, the states at the time 0 and the time 20 must be four states of (3,3), (3,7), (7,3) and (7,7)" is set.

In this embodiment, the partitioning is used as a rule to prevent the QC sequence. The constraint required for the power density of the code to become null at the Nyquist frequency is for ADS, and the Viterbi detection is performed by using information of ADS. Accordingly, the partitioning is also performed for ADS.

According to the partitioning, in the codes having four states (3,3), (3,7), (7,3) and (7,7) as start points, ADS is not reduced to 3 or less at any one time for code words each having as a start point a state whose ADS is equal to 3, and ADS is not increased to 7 or more at any one time for code words each having as a start point a state whose ADS is equal to 7.

If a late time is set as the time suffering the above restriction, the number of code words can be generally increased. However, as the time is late, the number of different paths extending from a start point to that time is increased. Therefore, in this embodiment, the time suffering the restriction is set to 7 on the assumption that a part of the method proposed in J. W. Rae, G. S. Christinansen, P. Siegel, R. Karabed, H. Thapar, and S. Shih, "Design and Performance of a VLSI 120 Mb/s Trellis-Coded Partial Response Channel", IEEE Transactions on Magnetics, Vol. 31, No. 2, March 1995, pp.1208–1214 is applied to a Viterbi detector.

That is, the constraint 3 to the code word sets "(1) a path which starts at time 0 from a state whose ADS is equal to 3 is prohibited from passing at time 7 a state whose ADS is equal to 0 and a state whose ADS is equal to 2. (2) a path which starts at time 0 from a state whose ADS is equal to 7 is prohibited from passing at time 7 through a state whose ADS is equal to 8 and a state whose ADS is equal to 10".

In this embodiment, the number of code words when the state (3,3) or (7,7) is set as a start point is equal to 88992, and the number of code words when the state (3,7) or (7,3) is set as a start point is equal to 82944. The number of code words needed in the present invention is equal to 65536, and in both the cases a large number of code words are left over.

Therefore, the maximum continuous length of the same symbol of the code is set to be smaller than 10. In FSTD of FIG. 6, the same bit continues for the longest time in both of a case where RDS is incremented one by one and the transition is carried out from the minimum RDS (the minimum value of RDS) to the maximum RDS (the maximum value of RDS) and a case where RDS is reduced one by one and the transition is carried out from the maximum RDS to the minimum RDS. Accordingly, the same bits of ten are continued in the longest time case.

In order to set the maximum continuous length of the same symbol of the code to 9, in FSTD of FIG. 6, it is sufficient that the state is prohibited from arriving at a state having RDS of 10 when the state starts from a state having RDS of 0 and undertakes ten state transitions, and also the state is prohibited from arriving at a state having RDS of 0 when the state starts from a state having RDS of 10 and undertakes ten state transitions. It is impossible to set the maximum continuous length of the same symbol of the code to 8 because the number of code words as candidates is short.

The constraint 4 to the code word sets "(1) a path starting from a state having RDS of 3 at time 0 must satisfy the following four conditions: (a) it does not pass through a state having RDS of 0 at time 3; (b) it does not pass through a state having RDS of 10 at time 7; (c) it does not transit from a state having RDS of 0 at time 5 to a state having RDS of 10 at time 15 while RDS is incremented one by one; and (d) it does not transit from a state having RDS of 0 at time 7 to a state having RDS of 10 at time 17 while RDS is incremented one by one. (2) a path starting from a state having RDS of 7 at time 0 must satisfy the following four conditions: (a) it does not pass through a state having RDS of 10; (b) it does not pass through a state having RDS of 0 at time 7; (c) it does not transit from a state having RDS of 10 at time 5 to a state having RDS of 0 at time 15 while RDS is decremented one by one, and (d) it does not transit from a state having RDS of 10 at time 7 to a state having RDS of 0 at time 17 while RDS is decremented one by one".

The 20-bit code word output from the encoding circuit 21 is supplied to the code word examining circuit 24 to examine the type of and the end point of the code word. The type and the end point can be known through a process of successively calculating the values of ADS and RDS from a bit at the start point side of the code word and the calculation result while the values of ADS and RDS at the start point of the code word thus supplied are set as initial values. The calculation method of ADS and RDS is apparent from the above definition.

Assuming that the RDS value of the start point of the code word encoded in the code word circuit 21 is equal to 3, the type of the code word is identified by judging through the process of successively calculating the value of RDS whether RDS is larger than 6 or not. In this embodiment, a judgment indicating that RDS is not larger than 6 is set as "type 0" and a judgment indicating that RDS is larger than 6 is set as "type 1". The initial value of RDS is equal to 3, so that RDS is necessarily equal to 7 at any time subsequent to the time 4 (containing the time 4) when RDS is larger than 6. In addition, it is apparent on the definition of RDS that only an even-number time is considered as a candidate time at which RDS may be equal to 7. Accordingly, the type of the code word is identified by judging whether the value of RDS is equal to 7 at an even-number time subsequent to the time 4.

As described above, when RDS of a state serving as a start point of a code word encoded in the code word circuit 21 is equal to 3, the type of the code word is identified by judging whether RDS is equal to 7 or not. However, when RDS of a state serving as a start point of a code word encoded in the code word circuit 21 is equal to 7, the type of the code word is identified by judging whether RDS is equal to 3 or not. As described later in detail, it is apparent that the calculation result of ADS and RDS obtained by continuing the calculation to the last bit of the code word expresses the state of the end point of the code word.

Figure 7:
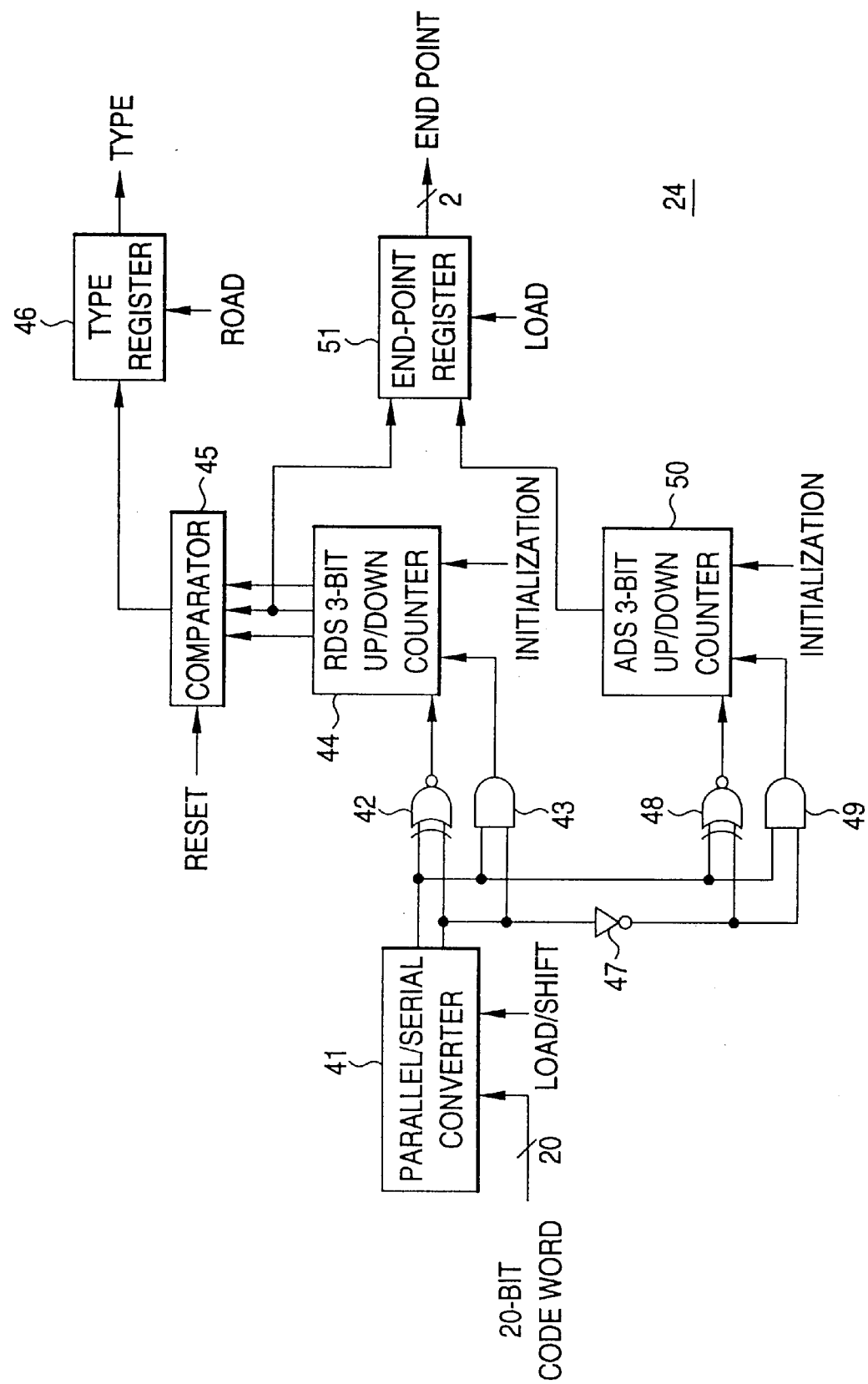
FIG. 7 is a block diagram showing the construction of a code word examining circuit 24 of FIG. 4.

FIG. 7 shows a specific circuit construction of the code word examining circuit 24 when the start point of the code word encoded in the code word circuit 21 is a state (3,3).

An RDS 3-bit UP/DOWN counter 44 and an ADS 3-bit UP/DOWN counter 50 are initialized to 1 at an interval between code words, and the output of a comparator 45 is reset. Thereafter, the 20-bit code word input is segmented from the start point side every 2 bits in a parallel/serial converter 41, and the segmented parts are successively fed out. The 2-bit data thus fed out are supplied to each of EXNOR 42 and AND 43 and subjected to operations. The output of EXNOR 42 is supplied to ENABLE terminal of the RDS 3-bit UP/DOWN counter 44, and the output of AND 43 is supplied to UP/DOWN terminal of the RDS 3-bit UP/DOWN counter 44. The RDS 3-bit UP/DOWN counter 44 successively operates RDS.

With respect to the 2-bit data fed out from the parallel/serial converter 41, bits which are at a late time side viewed from the start point are inverted by an inverter 47, and supplied to and operated in each of EXNOR 48 and AND 49. The output of EXNOR 48 is supplied to ENABLE terminal of the ADS 3-bit UP/DOWN counter 50, and the output of AND 49 is supplied to UP/DOWN terminal of the ADS 3-bit UP/DOWN counter 50. The ADS 3-bit UP/DOWN counter 50 successively operates ADS.

With respect to the values of ADS and RDS obtained by continuing the calculation to the last of the code word, a second bit from LSB is picked up for each of ADS and RDS, and stored in an end point register 51 at an interval between the codewords. The output of the RDS 3-bit UP/DOWN counter 44 is supplied to a comparator 45, and successively compared with 3 to the last of the code word. Even when the output is coincident with 3 once, the output of the comparator 1 is set to 1, and stored in a type register 46 at the interval between the code words. The output of the type register 46 and the end-point register 51 are output as the type and the end point of the code word from the code word examining circuit 24.

When ADS of the start point of the code word encoded in the code word circuit 21 is equal to 7, the initial value of the ADS 3-bit UP/DOWN counter 50 is set to 3. When RDS of the start point of the code word encoded in the code word circuit 21 is equal to 7, the initial value of the RDS 3-bit UP/DOWN counter 44 is set to 3, and the output of the comparator 45 is set to 1.

In FIG. 7, every 2 bits of each of the values of ADS and RDS are successively operated at a time. This is because it is most efficient to operate each of ADS and RDS every 2 bits in consideration of the characteristic of the definition of ADS and RDS. When the operation is successively carried out every bit, the operation of setting the value of each of ADS and RDS to "+1" or "−1" must be repeated 20 times. On the other hand, when the operation is successively carried out every 2 bits, the operation of setting the value of each of ADS and RDS to "+2", "−2" or doing nothing is repeated 10 times. Here, "+2" and "−2" may be replaced by "+1" and "−1". The operation of "+1" and "−1" may be implemented by the UP/DOWN counter. When the operation is successively carried out bit by bit, the UP/DOWN counter must be designed so as to count 0 to 10 (4-bit counter). On the other hand, when the operation is successively carried out every 2 bits, it may be designed so as to count 0 to 4 (3-bit counter). That is, the construction in which the calculation is performed every 2 bits needs only a half of the operation frequency of the construction in which the calculation is carried out every bit, and the bit width of the UP/DOWN counter can be reduced by one bit.

It is possible to examine the type and the end point of the code word in advance and store them together with the code word in the encoding circuit 21. In this case, the code word examining circuit 24 is not required, however, the circuit scale of the encoding circuit 21 is increased.

The state set as the end point of the code word output from the code word examining circuit 24 is supplied to the end-state conversion circuit 25. The end-state conversion circuit 25 stores the state set as the end point thus supplied into the register 26, and determines the state serving as the end point of the code word to be currently output from the code word conversion circuit 22 on the basis of the state serving as the start point of the code word which is stored in the register 26 and is to be currently output from the code word conversion circuit 22 (the state serving as the end point of the code word which was previously output from the code word conversion circuit 22). The state serving as the end point output from the end-state conversion circuit 25 is stored in the register 26, and set as the state serving as the end point of a code word to be next output from the code word conversion circuit 22.

When the state serving as the start point of the code word to be currently output from the code word conversion circuit 22 is located so as to be symmetrical with the state serving as the start point of the code word to be currently output from the encoding circuit 21 with respect to point or axis, the state serving as the end point of the code word to be currently output from the code word conversion circuit 22 is located so as to be symmetrical with the state serving as the end point of the code word to be currently output from the encoding circuit 21 with respect to point or axis. Accordingly, the state serving as the end point of the code word output from the encoding circuit 21 is converted to a state which is located so as to be symmetrical with the state concerned with respect to point or axis. That is, if there is any difference between the state serving as the start point of the code word output from the code word conversion circuit 22 (the output of the code word examining circuit 24) and the state serving as the start point of the code word output from the encoding circuit 21 (the output of the register 26), the element of the state serving as the end point output from the encoding circuit 21 which corresponds to a different element (ADS or RDS) is converted to a different value (3 is converted to 7,7 is converted to 3).

In this embodiment, there are only two kinds where ADS and RDS of the start point and the end point are equal to 3 or 7. This means that both of ADSD and RDS of the start point and the end point can be expressed by 1 bit.

It is assumed that the state serving as a start point of a code word output from the encoding circuit 21 is set to (0,0), and states serving as other start and end points are expressed by 0 when the values of ADS and RDS thereof are the same as ADS and RDS serving as the start point of the code word output from the encoding circuit 21 and by 1 when they are different. For example, when the start point of the code word encoded by the encoding circuit 21 is (3,3), the state (3,3) is expressed as the state (0,0), the state (3,7) is expressed as the state (0,1), the state (7,3) is expressed as the state (1,0), and the state (7,7) is expressed as the state (1,1).

Figure 8:
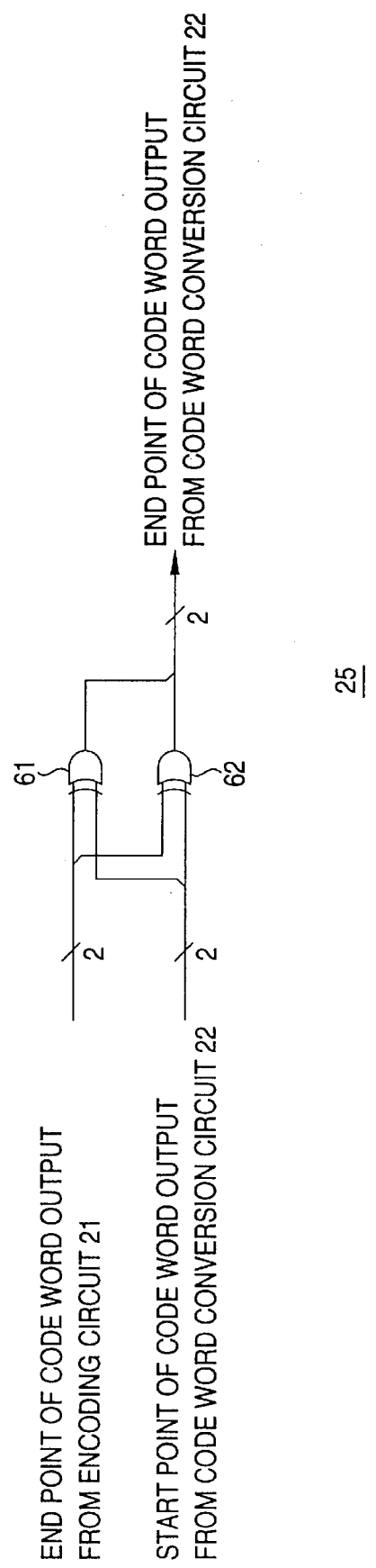
FIG. 8 is a circuit diagram showing the construction of an end point state conversion circuit 25 of FIG. 4.

According to the above expression, in the end-state conversion circuit 25, each bit of the output of the register 26 (the state serving as the start point of the code word output from the code word conversion circuit 22) is equal to 1, the corresponding output bit of the code word examining circuit 24 may be inverted. This is equivalent to addition of mod 2 for each bit. That is, as shown in FIG. 8, the conversion of the state of the end point is carried out by using mod2 adders (EXOR) 61 and 62.

The code word conversion circuit 22 will be described. The code word output from the encoding circuit 21, the type of the code word output from the code word examining circuit 24 and the state serving as the start point output from the register 26 are supplied to the code word conversion circuit 22. The code word conversion circuit 22 converts the code word having the state (0,0) as a start point to a code word having a state indicated by the register 26 as a start point on the basis of the type of the code word, for example.

When the state serving as the start point of the code word output from the code word conversion circuit 22 is located so as to be symmetrical with the state serving as the start point of the code word output from the encoding circuit 21 with respect to point or axis, the code word output from the encoding circuit 21 is converted to a code word which transits through states located so as to be symmetrical with targeted point or axis from the start point to the end point. However, on the structure of FIG. 6, when successively considering the status transition after the conversion from the start point with respect to the ADS axis or RDS axis passing through the center point of FSTD, the transition to a state located at a symmetrical position with respect to axis is possible at an even-number time, however, it is impossible at an odd-number time. Therefore, in the present invention, in the case of the conversion with respect to the ADS axis or RDS axis passing through the center point of FSTD, the code word output from the encoding circuit 21 is converted to a code word which transits at an even-number time through a state located so as to be symmetrical with a targeted axis and also transmits at an odd-number time through a state which is uniquely determined in association with the state to which the code word transmits at the even-number time. Accordingly, it is possible to perform the conversion between code words whose start states are located symmetrically with each other with respect to point or axis. Further, a data word which is allocated to a code word before conversion (a code word output from the encoding circuit 21) is directly allocated to the code word converted in the code word conversion circuit 22.

However, considering the decoding, the above conversion rule should not be applied to some code words.

There is set a constraint to allocation of code words: "(1) the same code words having different start states must be allocated to the same data word. (2) code words which are in all-bit inversion relationship must be allocated to the same data word".

The constraint (1) to the code word allocation will be described. In a case where a code word $C_{11}$ contained in a code $C_1$ having a state as a start point and a code word $C_{21}$, contained in a code $C_2$ having a different state as a start point are the same code word, if the code word $C_{11}$ is allocated to a data word di contained in data D and the code word $C_{21}$ is allocated to another data word $d_2$ contained in data D, the start point of the code word could not be known at the decoding time. Accordingly, when the code word $c_{11}$ or the code word $c_{21}$ is obtained, the data word ($d_1$ or $d_2$) to which the code word should be decoded cannot be identified.

In this embodiment, the start point of the code word is examined in the code word examining circuit 31 in the decoding operation. It is impossible to identify the state serving as the start point between the same code words in the code word examining circuit 31 because the transitions of ADS and RDS thereof are completely the same. This means that if the same code words exist in codes having as start points states which are symmetrical with each other with respect to point or axis and these code words are allocated to different data words, the data word to which the code word should be decoded cannot be identified.

For example, there is considered two code words $C_{11}$ and $C_{12}$ which are contained in a code $C_1$ having a state as a start point and are symmetrical with each other with respect to the start point or an axis passing through the start point. Here, it is assumed that $C_{11}$ and $C_{12}$ are allocated to different data words $d_1$ and $d_2$, respectively. If $C_{11}$ and $C_{12}$ are converted to code words $C_{21}$ and $C_{22}$ which are symmetrical with each other with respect to the center point of FSTD or an axis parallel to the above axis passing through the center point of FSTD, $C_{21}$ and $C_{22}$ are allocated to the data words $d_1$ and $d_2$.

The code words $C_{11}$ and $C_{12}$ are symmetrical with each other with respect to point or axis, and the code words $C_{12}$ and $C_{22}$ are also symmetrical with each other with respect to point or axis. Since it is apparent that if point-symmetrical conversion or symmetrical conversion with respect to the same direction axis is carried out twice, it is returned to the original code word. Therefore, $C_{11}$ and $C_{22}$ are the same code word. Accordingly, $C_{11}$ and $C_{22}$ must be allocated to the same data word. However, if the conversion is carried out on the basis of the code word conversion rule, they would be allocated to different data words $d_1$ and $d_2$.

In this embodiment, the same code words exist in codes having as start points states which are symmetrical with one another with respect to the ADS axis passing through the center point of FSTD of FIG. 6. These must be allocated to the same data word. However, if the above code word conversion rule is applied to all the code words, they would be allocated to different data words. Further, it is apparent on the constraint 3 to the code words that no same code words exist in codes having as start points states which are symmetrical with one another with respect to the center point of FSTD itself and the RDS axis passing through the center point of FSTD.

Next, the constraint to the code word allocation (2) will be described. It is assumed that the code words $C_{11}$ and $C_{31}$ are in all-bit inversion relationship with each other and $C_{11}$ is allocated to the data word $d_1$ while $C_{31}$ is allocated to the data word $d_2$. Here, since $C_{11}$ and $C_{31}$ are different code words, they could be originally decoded with no problem if the polarities of recording and reproduction are rightly managed in all the recording/reproducing devices. However, if the polarity at the recording time and the polarity at the reproduction time are inverted, for example when $C_{11}$ is received at the decoding time, it is erroneously decoded, not to the data word d1, but to the data word $d_2$.

It is a cumbersome work to manage all the polarities of individual recording/reproducing devices, and the polarity to detect, not the direction of magnetization, but the inversion of magnetization cannot be identified for some detection methods. In the case of NRZ recording, code words which are in all-bit inversion relationship with one another are generally allocated to the same data word.

There are considered two code words $C_{11}$ and $C_{12}$ which are contained in a code $C_1$ having a state as a start point and symmetrical with each other with respect to the axis passing through the start point. Here, it is assumed that $C_{11}$ and $C_{12}$ are allocated to the different data words $d_1$ and $d_2$, respectively. If $C_{11}$ and $C_{12}$ are converted to code words $C_{31}$ and $C_{32}$ which are symmetrical with each other with respect to an axis perpendicular to the above axis passing through the center point of FSTD, $C_{31}$ and $C_{32}$ are allocated to the data words $d_1$ and $d_2$.

The code words $C_{11}$ and $C_{12}$ are symmetrical with each other with respect to axis, and the code words $C_{12}$ and $C_{32}$ are symmetrical with each other with respect to the axis perpendicular to the above axis. It is apparent that if each of them is converted with respect to the perpendicular axis only once, they become all-bit-converted code words, $C_{11}$ and $C_{32}$ are all-bit-inverted code words. Accordingly, $C_{11}$ and $C_{32}$ must be allocated to the same data word, however, if the conversion is carried out on the basis of the code word conversion rule, they are allocated to the different data words $d_1$ and $d_2$.

In this embodiment, the code words having the all-bit inversion relationship exist between codes having as start points states which are symmetrical with each other with respect to the center point of FSTD, and between codes having as start points states which are symmetrical with each other with respect to the RDS axis passing through the center point of FSTD. These must be allocated to the same data words. The conversion with respect to the center point of FSTD corresponds to the all-bit inversion on the basis of the code word conversion rule, and the code words having the all-bit-inverted relationship are allocated to the same data words. Therefore, in this case, no problem occurs. However, in the conversion with respect to the RDS axis passing through the center point of FSTD, if the code word conversion rule is applied to all the code words, they may be allocated to different data words. Further, from the constraint 3 to the code words, no code words having the all-bit inverted relationship exist in codes having respective states as start points and between code words having as start points states which are symmetrical with reach other with respect to the ADS axis passing through the center point of FSTD.

In order to satisfy the constraint (1) to the code word allocation, the following two constraints are considered. (a) The code words $C_{11}$ and $C_{12}$ are allocated to the same data word $d_1$ or either $C_{11}$ or $C_{12}$ is not used as a code word. (b) In a case where $C_{12}$ exists for $C_{11}$, no code word conversion is carried out between $C_{11}$ and $C_{12}$.

In the case of (a), the code word conversion rule can be directly applied. However, in the case of (b), the code word conversion rule must be partially corrected. Comparing the cases (a) and (b), the number of code words which will be wasted is smaller in the case of (b) than in the case of (a).

In order to satisfy the constraint (2) to the code word allocation, the following two constraints are considered. (a) The code words $C_{11}$ and $C_{12}$ are allocated to the same data word $d_1$ or either of $C_{11}$ or $C_{12}$ is not used as a code word. (b) If $C_{12}$ exists for $C_{11}$, the code word conversion of $C_{11}$ and $C_{12}$ is set to the all-bit inversion.

In the case of (a), the code word conversion rule is directly applicable. However, in the case of (b), the code word conversion rule must be partially corrected.

Therefore, the code word conversion rule is corrected as follows. (1) When there exists a code word which is symmetrical with a code word with respect to the start point of the code word or an axis passing through the start point, the code word is not subjected to the conversion with respect to the center point of FSTD or an axis parallel to the above axis passing through the center point of FSTD. In this case, the code word conversion circuit 22 directly outputs a code word input thereto. (2) When there exists a code word which is symmetrical with a code word with respect to the axis passing through the start point of the code word, if the conversion with respect to an axis perpendicular to the above axis passing through the center point of FSTD is carried out on the code word, the conversion is set to the all-bit inversion.

In this embodiment, as described above, the same code words exist in codes having as start points states which are symmetrical with one another with respect to the ADS axis passing through the center of FSTD, and also code words which have the all-bit-inverted relationship exist in codes having as start points states which are symmetrical with one another with respect to the RDS axis passing through the center point of FSTD. Accordingly, the axis which is targeted by the correction items (1) and (2) of the code word conversion rule is the ADS axis passing through the center point of FSTD.

The case where there exists a code word which is axis-symmetrical with a code word means the case where axis-symmetrical states exist for all the states at even-number times from the start point to the end point of the code word. In this embodiment, a case where there exists a code word which is symmetrical with a code word with respect to an axis parallel to the ADS axis passing through the start point of the coded word corresponds to: a case where RDS is equal to 6 or less for a code word having as a start point a state whose RDS is equal to 3, and corresponds to a case where RDS is 4 or more for a code word having as a start point a state whose RDS is equal to 7.

This is the type of the code word as described above. When the code word encoded in the encoding circuit 21 has as a start point a state whose RDS is equal to 3, the type thereof is equal to "0" if the RDS of the code word is equal to 6 or less, and "1" if the RDS is equal to 7 or more. When the code word encoded in the encoding circuit 21 has as a start point a state whose RDS is equal to 7, the type thereof is equal to "0" if the RDS of the code word is equal to 4 or more, and "1" if the RDS value is equal to 3 or less.

Figure 9:
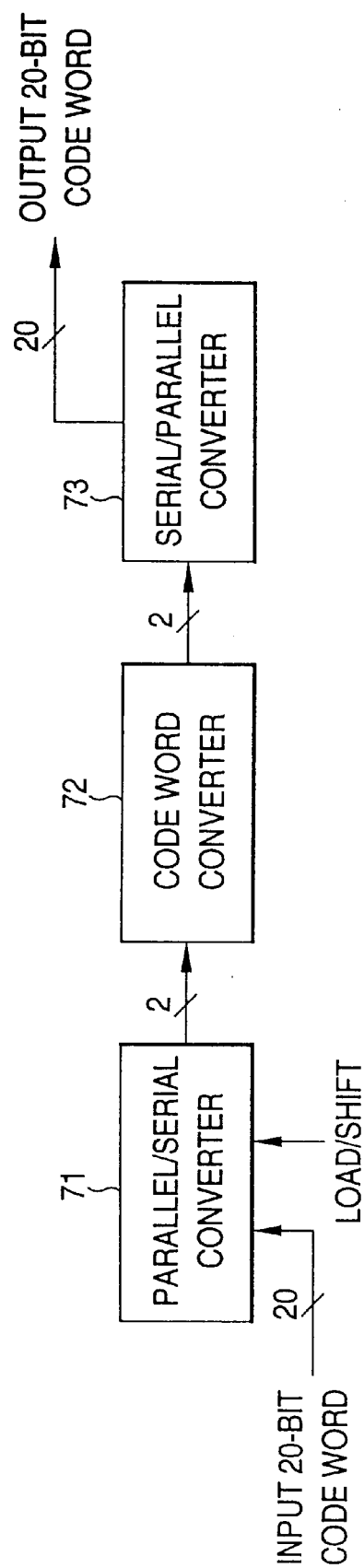
FIG. 9 is a block diagram showing the construction of a code word conversion circuit 22 of FIG. 4.

FIG. 9 shows the circuit construction of the code word conversion circuit 22. The conversion of the code word which is carried out in the code word converter 72 supplied with the code word from parallel/serial converter 71 on the basis of the code word conversion rule and the correction thereof will be described with reference to FIG. 10. The output code word at 20 is provided through serial/parallel converter 73 connected to the code word converter 72 as shown in FIG. 9. No conversion is carried out on the code word in the case of the state (0,0) of the start point. Accordingly, the code word input to the code word conversion circuit 22 is directly output.

In the case of the state (0,1) of the start point, when the type of the code word is equal to "0", no conversion is carried out on the code word according to the correction item (1) of the code word conversion rule. When the type of the code word is equal to "1", the code word is sectioned into 10 segments every 2 bits, and "00" is converted to "11" and "11" is converted to "00" for each segment.

In the case of the state (1,0) of the start point, when the type of the code word is equal to "0", all the bits of the code word are inverted according to the correction item (2) of the code word conversion rule. When the type of the code word is equal to "1", the code word is sectioned into 10 segments every 2 bits, and "01" and "10" are converted to "10" and "01" respectively for each segment.

In the case of the state (1,1) of the start point, all the bits of the code word are inverted according to the code word conversion rule.

In a case where a code word is converted according to FIG. 10, even when a code having as a start point a fixed state output from the encoding circuit 21 keeps the constraints 3 and 4 to the code word, some code word having as a start point a state which is output from the code word conversion circuit 22 and different from the above state may break the constraints 3 and 4 to the code word.

When only the transition of ADS is considered, the constraint 3 to the code word has a symmetrical structure with respect to the axis in the time direction which passes through the center of the ADS direction, and when only the transition of RDS is considered, the constraint 4 to the code word has a symmetrical structure with respect to the axis in the time direction which passes through the center of the RDS direction. Accordingly, if the code word conversion rule permits complete axially symmetrical conversion, the constraints 3 and 4 would be never broken even when the conversion of the code word is performed according to the code word conversion rule. However, since it is impossible from the view of the structure of FIG. 6 (that is, the properties of ADS and RDS) to perform the complete axially symmetrical conversion, the conversion based on the code word conversion rule may break the constraints. Further, it is apparent from that the correction of the code word conversion rule is not axially symmetrical conversion, so that the conversion based on the correction of the code word conversion rule may break the constraints.

Accordingly, in a case where when a path from a start point to an end point on FSTD is converted according to the code word conversion rule, if the path obtained through the conversion breaks the constraints, the corresponding path before the conversion is prohibited.

In this embodiment, the following constraints 5 to 7 are set in order to select a word code stored in the encoding circuit 21, whereby constraint violation as mentioned above can be prevented even when conversion between code words having axially-symmetrical start points is performed.

The constraint 5 to the code word sets: "(1) When the start point of a code encoded in the encoding circuit 21 is the state (3,3), a path having ADS set to 3 at time 6, 4 at time 7 and 3 at time 8 in those paths which start from the above state at time 0, is prohibited from having RDS of 7 at all times. (2) When the starting point of the code encoded in the encoding circuit 21 is the state (3,7), a path having ADS set to 3 at time 6, 4 at time 7 and 3 at time 8 in those paths which start from the above state at time 0, is prohibited from having RDS of 3 at all times. (3) When the start point of the code encoded in the encoding circuit 21 is the state (7,3), a path having ADS set to 7 at time 6, 6 at time 7 and 7 at time 8 in those paths which start from the above state at time 0 is prohibited from having RDS of 7 at all times. (4) When the start point of the code encoded in the encoding circuit 21 is the state (7,7), a path having ADS set to 7 at time 6, 6 at time 7 and 7 at time 8 in those paths which start from the above state at time 0 is prohibited from having RDS of 3 at all times".

The constraint 6 to the code word sets: "(1) When RDS of the start point of the code encoded in the encoding circuit 21 is equal to 3, a path having RDS of 6 at time 3 in those paths which start from the above state at time 0 must have RDS of 7 at any one of the times. (2) When RDS of the start point of the code encoded in the encoding circuit 21 is equal to 7, a path having RDS of 4at time 3 in the paths starting from the above state at time 0 must have RDS of 3 at any one of the times".

The constraint 7 to the code word sets: "(1) When RDS of the start point of the code encoded in the encoding circuit 21 is equal to 3, a path starting from the above state at time 0 must satisfy the following conditions: (a) it is prohibited from having RDS which is equal to 1 at time 2, 2 at time 3, 1 at time 4 and 7 or more at any one of the times; (b) it is prohibited from having RDS which is equal to 1 at time 4, 2 at time 5, 1 at time 6, 9 at time 14, 8 at time 15 and 9 at time 16; (c) it is prohibited from having RDS which is equal to 1 at time 6, 2 at time 7, 1 at time 8, 9 at time 16, 8 at time 17 and 9 at time 18; and (d) it is prohibited from having RDS which is equal to 9 at time 6, 8 at time 7 and 9 at time 8. (2) When RDS of the start point of the code encoded in the encoding circuit 21 is equal to 7, a path starting from the above state at time 0 must satisfy the following conditions: (a) it is prohibited from having RDS which is equal to 9 at time 2, 8 at time 3, 9 at time 4 and 3 or less at any one of the times; (b) it is prohibited from having RDS which is equal to 9 at time 4, 8 at time 5, 9 at time 6, 1 at time 14, 2 at time 15 and 1 at time 16; (c) it is prohibited from having RDS which is equal to 9 at time 6, 8 at time 7, 9 at time 8, 1 at time 16, 2 at time 17 and 1 at time 18; and (d) it is prohibited from having RDS which is equal to 1 at time 6, 2 at time 7 and 1 at time 8".

The constraint 5 to the code word is set so that the constraint 3 to the code word is not broken when the conversion of the code word is carried out according to the code word conversion rule. The constraint 6 to the code word is set so that when the code-word conversion is carried out according to the correction of the code word conversion rule, the constraint 4 to the code word is not broken. The constraint 7 to the code word is set so that when the code-word conversion is carried out according to the code word conversion rule, the constraint 4 to the code word is not broken.

The number of code words satisfying the above code-word constraints 1 to 7 is equal to 70773 for each start point, and code words of 65536 are selected from the above code words. As described above, the selected 16-bit data codes to be encoded in the encoding circuit 21 are allocated to 20-bit code words in one-to-one correspondence.

Figure 11:
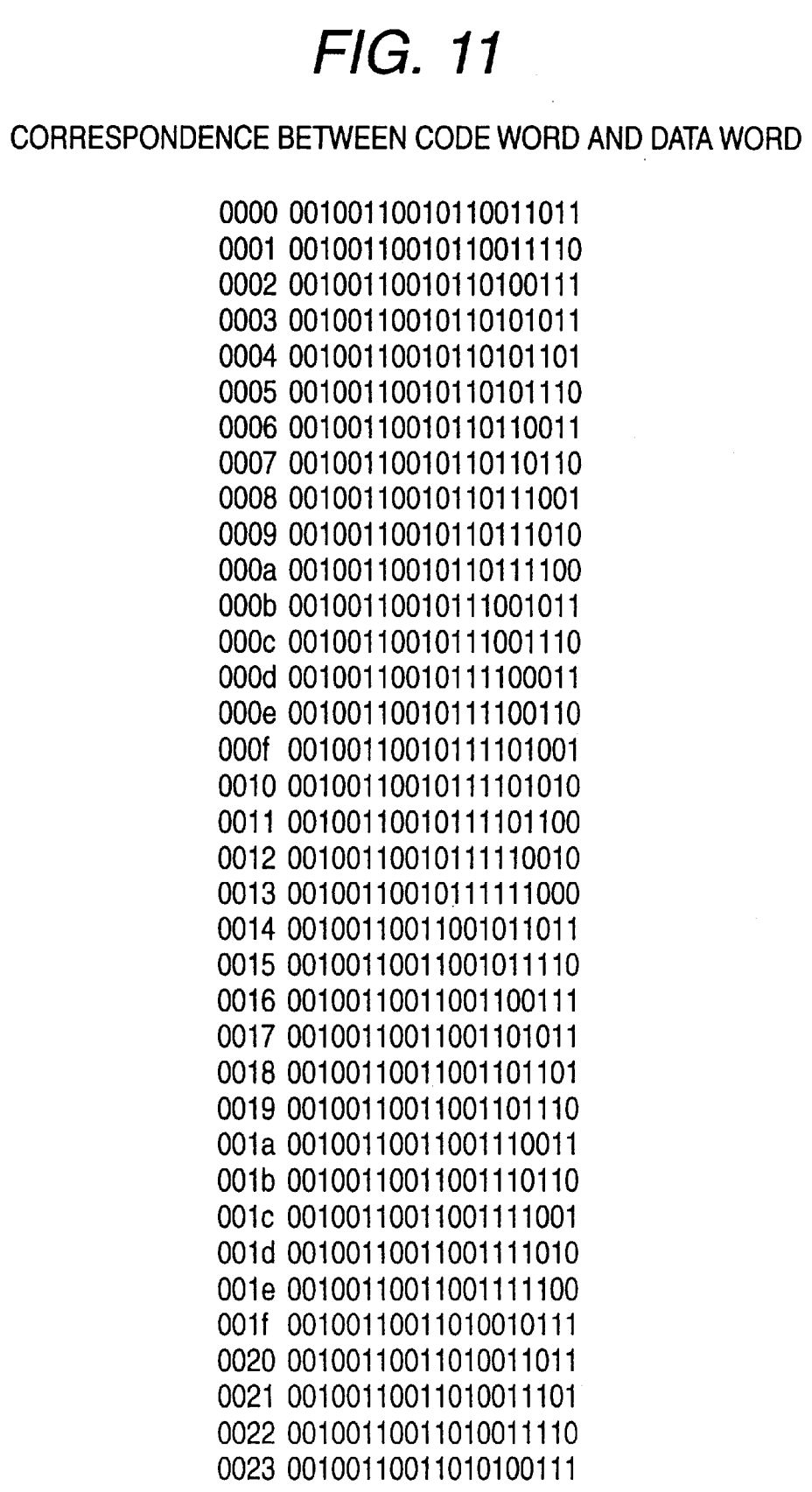
Figure 12:
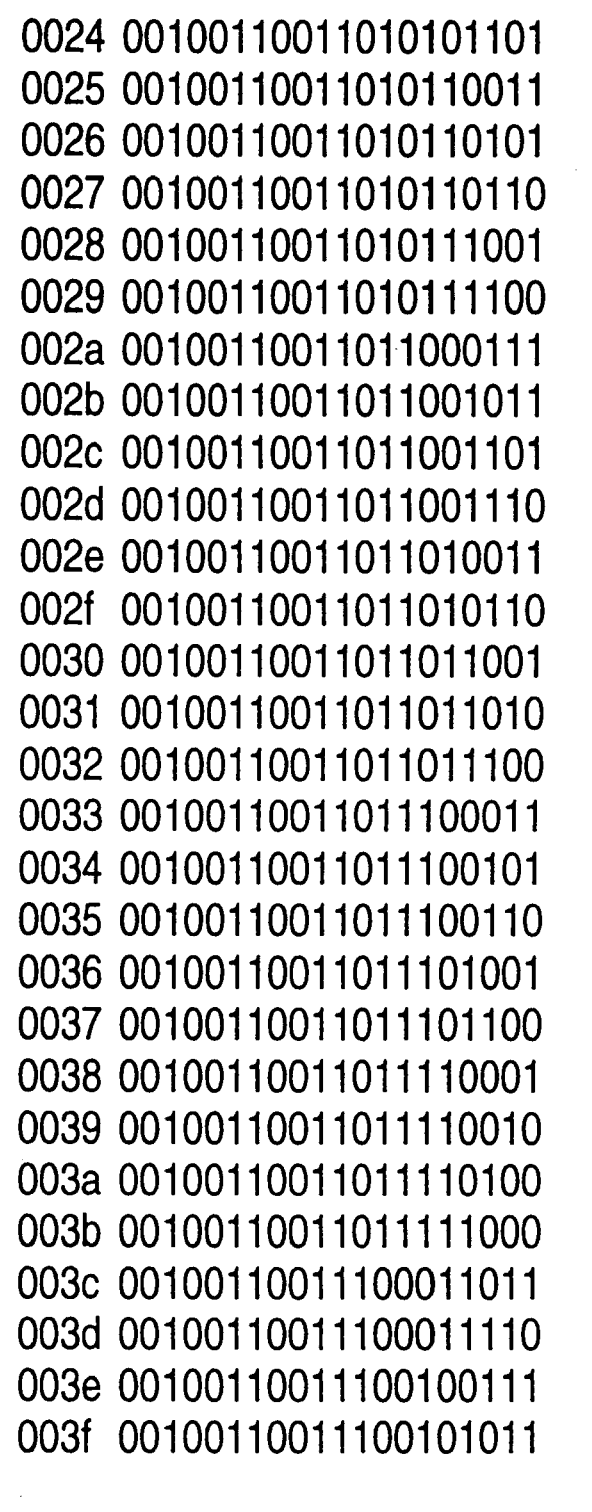

FIGS. 11 and 12 show a part of the correspondence between the data word and the code word when a start point encoded in the encoding circuit 21 is the state (3,3). The 16-bit data words are expressed by hexadecimal numbers on the left column, and the 20-bit code words are expressed by binary numbers on the right column.

The 20-bit code words output from the code word conversion circuit 22 are supplied to the parallel/serial (P/S) converter 23. In the P/S converter 23, the 20-bit code word as parallel data from the code word conversion circuit 22 is converted to serial data and the serial data thus obtained are output.

A 20-bit code word sequence which is converted to the serial data is recorded through the recording amplifier 2 into the media 3.

When the media 3 is reproduced, a reproduction signal thus obtained is amplified in the reproduction amplifier 4, equalized in the equalizer amplifier 5 and then supplied to the sampler 6 and the PLL circuit 9.

The PLL circuit 9 generates clocks on the basis of the reproduction signal input thereto, and supplies the clocks thus generated to the sampler 6, the TCPR Viterbi detector 7, the decoder 8, the PRML Viterbi detector 10 and the SYNC detector 11.

In the sampler 6, the three-valued reproduction signal to which external disturbance is applied from the equalizer amplifier 5 is sampled in synchronism with the clocks supplied from the PLL circuit 9. The sample value thus obtained is supplied to the TCPR Viterbi detector 7 and the PRML Viterbi detector 10 to detect the original two-dimensional code.

The code word sequence detected in the PRML Viterbi detector 10 is supplied to the SYNC detector 11 to detect a SYNC pattern. The synchronization signal to the code word thus obtained is supplied to the TCPR Viterbi detector 7 to establish synchronization.

The TCPR Viterbi detector 7 has a time variable structure (the structure is varied with time) in accordance with the constraints 2 and 3 to the code word, so that the detection could not be started unless the boundary of 20-bit code words is known. Therefore, it is necessary to detect a bit sequence by the PRML Viterbi detector 10 before the Viterbi detection of TCPR is started, and then detect the code boundary on the basis of the bit sequence by the SYNC detector 11. The PRML Viterbi detector 10 has an time invariable structure, and thus it needs no synchronous signal to the code word.

The 20-bit code word detected by the TCPRViterbi detector 7 is supplied to the decoder 8 and decoded into an original 16-bit data word.

Each of all the states (3,3), (3,7), (7,3) and (7,7) may be potentially determined as a candidate of the start point of the code word input to the decoder 8. However, in this embodiment, the start point of the code word decoded in the decoding circuit 33 is any one state. Therefore, in order to perform the correct decoding in the decoding circuit 33, the code word input to the decoder 8 must be beforehand converted to a code word which can be decoded by the decoding circuit 33. In order to satisfy this, the start point and the type of the code word input must be known.

The code word input to the decoder 8 is input to the code word examining circuit 31 which serves to examine the start point and the type of the code. In the code word examining circuit 31, the transition of ADS and RDS of the input code word is examined on the assumption that any one of the states (3,3), (3,7), (7,3) and (7,7) was the start point.

ADS of the start point of the code word can be known by checking whether the transition of ADS thus examined satisfies the constraint 3 to the code word. If it satisfies the code-word constraint 3, the ADS of the start point which is beforehand assumed is judged to be correct. If it does not satisfy the code-word constraint 3, the ADS of the start point which is beforehand assumed is judged to be incorrect.

The RDS of the start point of the code word can be known by checking whether the transition of RDS thus examined satisfies the constraint 1 to the code word. Common code words exist between codes having as start points states whose RDSs are different from each other. Accordingly, if the RDS transition satisfies the constraint 1, RDS of the start point cannot be specified for these common code words. However, since the same code words having different RDS values of start points thereof are allocated to the same data word by the correction of the code word conversion rule, and thus even when the RDS of the start point is incorrect, the decoding result is the same and thus it is unnecessary to specify RDS. With respect to code words which are not common, if the RDS transition satisfied the constraint 1, the RDS of the start point which is beforehand assumed is judged to be correct. On the other hand, if it does not satisfy the constraint 1, the RDS of the start point which is beforehand assumed is judged to be incorrect.

On the basis of the definition of the type as described above, the type of the code word can be known by judging whether there exists code words which are symmetrical with one another with respect to the axis in the ADS direction passing through a state which is assumed as a start point. In this embodiment, when symmetrical code words exist, the type of the code word is equal to 0. When no symmetrical code word exists, the type of the code word is equal to 1.

The following processing is carried out in the code word examining circuit 31. When ADS of the start point is assumed to be 3, ADS of the time 7 is examined. If ADS is larger than 3, ADS of the start point of the input code word is assumed to be 3. If ADS of the time 7 is smaller than 3, ADS of the start point of the code word is assumed to be 7.

When ADS of the start point is assumed to be 7, ADS of the time 7 is examined. If it is smaller than 7, ADS of the start point of the input code word is assumed to be 7. If it is larger than 7, ADS of the start point of the code word is assumed to be 3.

When RDS of the start point is assumed to be 3, the transition of RDS is examined. If it is neither equal to −1 nor 7 at any time, RDS of the start point of the input code word is assumed to be 3. If not so, RDS of the start point of the input code word is assumed to be 7.

When RDS of the start point is assumed to be 3, the transition of RDS is examined. If it is not equal to −1 at any time, the type of the code word is assumed to be 0. If not so, it is assumed to be 1.

When RDS of the start point is assumed to be 7, the transition of RDS is examined. If it is not equal to 11 at any time, RDS of the start point of the input code word is assumed to be 7. If not so, RDS of the start point of the input code word is assumed to be 3.

When RDS of the start point is assumed to be 7, the transition of RDS is examined. If it is equal to neither 3 nor 11 at any time, the type of the code word is assumed to be 0. If not so, the type of the code word is assumed to be 1.

Figure 13:
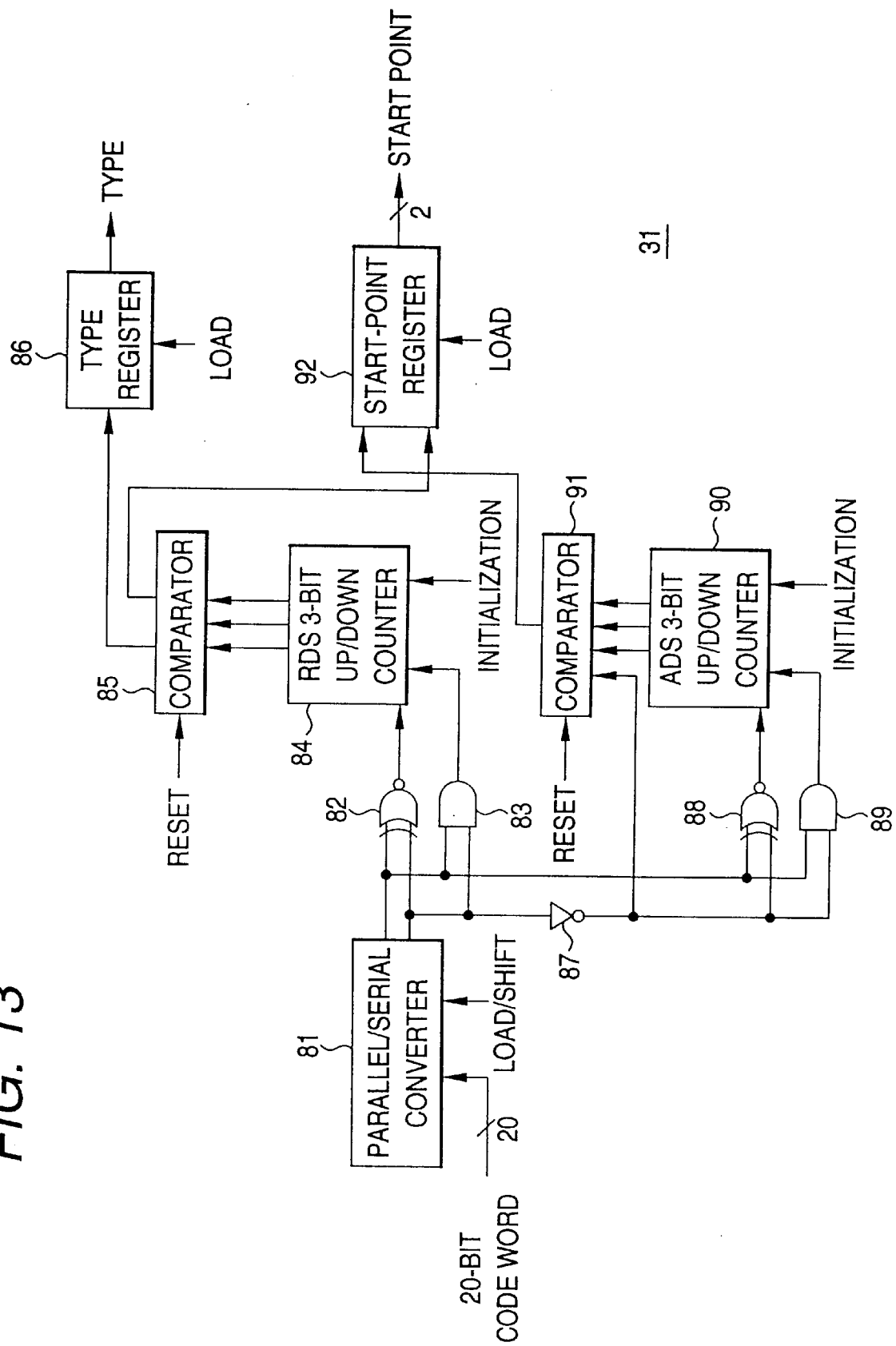
FIG. 13 is a block diagram showing the construction of a code word examining circuit 31 of FIG. 5.

FIG. 13 shows the construction of the code word examining circuit 31 when the start point of the code word encoded in the encoding circuit 21 is the state (3,3).

First, the RDS 3-bit UP/DOWN counter 84 and the ADS 3-bit UP/DOWN counter 90 are initialized at the interval between the code words, and the count values thereof are set to 1. The output of a comparator 85 and a comparator 91 are reset. Thereafter, the input 20-bit code word is sectioned from the start point side every 2 bits in the parallel/serial converter 81, and the segments thus obtained are successively fed out. The 2-bit data thus fed out are supplied to EXNOR 82 and AND 83 to be operated. The output of EXNOR 82 is supplied to ENABLE terminal of the RDS 3-bit UP/DOWN counter 84, and the output of the AND 83 is supplied to the UP/DOWN terminal of the RDS 3-bit UP/DOWN counter 84. The RDS 3-bit UP/DOWN counter 84 successively operates RDS.

With respect to the 2-bit data fed out from the parallel/serial converter 81, the bits at a late time side viewed from the start point are inverted in the inverter 87, and supplied to EXNOR 88 and AND 89 to be operated. The output of EXNOR 88 is supplied to ENABLE terminal of the ADS 3-bit UP/DOWN counter 90, and the output of AND 89 is supplied to UP/DOWN terminal of the ADS 3-bit UP/DOWN counter 90. The ADS 3-bit UP/DOWN counter 90 successively operates ADS.

The output of the RDS 3-bit UP/DOWN counter 84 is supplied to the comparator 85, and successively compared with 3 and 7 until the last of the codeword. When it is coincident with either 3 or 7 even once, one of the outputs of the comparator 85 is set to 1, and stored into a type register 86 at the interval between the code words. When it is coincident with 7 even once, the other output of the comparator 85 is set to 1, and stored at the LSB side of the start point register 92 at the interval between codes.

On the other hand, the output of the ADS 3-bit UP/DOWN counter 90 is supplied to a comparator 91 to check whether a counter value obtained by performing the operation until a sixth bit of the code word and a counter value from a seventh bit are equal to 1 and the inverted bit of the seventh bit is equal to 0 or not, the counter value is equal to 0 or not, the counter value is equal to 7 or not, or the counter value is equal to 6 or not. If any one of the judgments is true, the output of the comparator 91 is set to 1, and stored at the MSB side of the start-point register 92. The output of the type register 86 and the output of the start-point register 92 are output as the type and start point of the code word from the code word examining circuit 31.

The start point and the type of the code word output from the code word examining circuit 31 are supplied to the code word conversion circuit 32. The 20-bit code word is directly input to the code word conversion circuit 32. On the basis of the start point and type of the code, the code word conversion circuit 32 converts the input code word to a code word to which the decoding circuit 33 decodes. The conversion method is the same as shown in FIG. 10. That is, the code word conversion circuit 32 is the same as the code word conversion circuit 22.

The code word converted by the code word conversion circuit 32 is decoded to an original 16-bit data word associated by the encoding circuit 21 in the decoding circuit 33.

The present invention is not limited to the above embodiment, and various modifications and applications may be considered without departing from the subject matter of the present invention.

In the foregoing description, a supply medium for supplying a computer program for executing the above processing to users contains not only information recording medium such as a magnetic disc, a CD-ROM or the like, but also a transmission medium of a network such as Internet, a digital satellite or the like.

As described above, according to the encoding method and the encoding device of the present invention, only a code word having a predetermined state as a start point is encoded from a data word, and code words having other states as start points can be obtained through further conversion. Accordingly, the encoder can be designed in a compact size and operated at high speed.

According to the decoding method and the decoding device of the present invention, an input code word is converted to a code word having a predetermined state as a start point, and a data word can be obtained by decoding the code word. Accordingly, the decoder can be designed in a compact size.

What is claimed is:

1. An encoding method for encoding m-bit data to an n-bit code, characterized in that: the n-bit code is generated according to a finite state transition diagram representing the restriction of ADS and RDS received by a code sequence; two states contained in a state assembly set as start points of the n-bit code in the finite state transition diagram exist at symmetrical positions with respect to the center point of the finite state transition diagram, at symmetrical positions with respect to the ADS axis passing through the center point of the finite state transition diagram or at the symmetrical positions with respect to the RDS axis passing the center point of the finite state transition diagram; the m-bit data are encoded to an n-bit code word having as a start point a predetermined state contained in a state assembly set as start points of the code; and an n-bit code word having as a start point another state contained in a state assembly set as start points by the code is obtained by further converting the encoded code word.

2. The encoding method as claimed in claim 1, wherein when the maximum value and the minimum value of ADS are maximum ADS and minimum ADS respectively, the difference between the maximum ADS and the minimum ADS is set to a multiple of 2, and when the maximum value and the minimum value of RDS are maximum RDS and minimum RDS respectively, the difference between the maximum RDS and the minimum RDS is set to a multiple of 2.

3. The encoding method as claimed in claim 2, wherein when n is set to a multiple of 4, a state on the finite state transition diagram is expressed by (ADS, RDS), (minimum ADS+maximum ADS)/2 is set to center ADS, and (minimum RDS+maximum RDS)/2 is set to center RDS, a state set as a start point by the code is one of the following four states: a state (center ADS−2, center RDS−2); a state (center ADS−2, center RDS+2); a state (center ADS+2, center RDS−2); and a state (center ADS+2, center RDS+2).

4. The encoding method as claimed in claim 3, wherein m is equal to 16, and n is equal to 20.

5. The encoding method as claimed in claim 4, wherein the difference between the maximum ADS and the minimum ADS is equal to 10, and the difference between the maximum RDS and the minimum RDS is equal to 10.

6. The encoding method as claimed in claim 5, wherein when the code word takes a start point at time 0, a path departing at time 0 from a state in which ADS is equal to (center ADS −2) does not arrive, at time 7, at a state in which ADS is equal to (center ADS−2) or less, and a path departing at time 0 from a state in which ADS is equal to (center ADS+2) does not arrive, at time 7, at a state in which ADS is equal to (center ADS+2) or more.

7. The encoding method as claimed in claim 5, wherein on the finite state transition diagram, the state is prohibited from departing from a state in which RDS is equal to the minimum RDS and arriving at a state in which RDS is equal to the maximum RDS through ten state transitions, and also prohibited from departing from a state in which RDS is equal to the maximum RDS and arriving at a state in which RDS is equal to the minimum RDS through ten state transitions.

8. The encoding method as claimed in claim 7, wherein conversion between code words having as start points those states which are symmetrical with each other with respect to the center point of the finite state transition diagram is performed so that each state taken from a start point to an end point by a code word before the conversion and each state taken from a start point to an end point by a code word after the conversion are located symmetrically with each other, that is, all bits of the code word are inverted.

9. The encoding method as claimed in claim 7, wherein the conversion between codes having as start points states which are located symmetrically with one another with respect to the ADS axis passing through the center point of the finite state transition diagram is performed so that respective states taken at even-number times from a start point to an end point by a code word before the conversion and respective states taken at odd-number times from a start point to an end point by a code word after the conversion are located symmetrically with each other with respect to the ADS axis passing the center point, and the respective states taken at the odd-number times by the code word after the conversion are uniquely determined on the basis of the respective states at the even-number times by the code word after the conversion, that is, so that the code word is sectioned from the bit of the start point side every 2 bits to convert "00" to "11", "01" to "01", "10" to "10" and "11" to "00".

10. The encoding method as claimed in claim 7, wherein the conversion between codes having as start points states which are located symmetrically with one another with respect to the RDS axis passing through the center point of the finite state transition diagram is performed so that respective states taken at even-number times from a start point to an end point by a code word before the conversion and respective states taken at odd-number times from a start point to an end point by a code word after the conversion are located symmetrically with each other with respect to the RDS axis passing the center point, and the respective states taken at the odd-number times by the code word after the conversion are uniquely determined on the basis of the respective states at the even-number times by the code word after the conversion, that is, so that the code word is sectioned from the bit of the start point side every 2 bits to convert "00", to "00", "01" to "10", "10" to "01" and "11" to "11".

11. The encoding method as claimed in claim 8, wherein when a state which is symmetrical with a state taken as a start point by a predetermined code word exists for all states taken at each time from a start point to an end point by the predetermined code word, the conversion with respect to the center point is not performed on the predetermined code word.

12. The encoding method as claimed in claim 9, wherein when a state which is symmetrical with respect to the ADS axis passing through a state taken as a start point by a predetermined code word exists for all states taken at even-number times from a start point to an end point by the predetermined code word, the conversion with respect to the ADS axis passing through the center point is not performed on the predetermined code word.

13. The encoding method as claimed in claim 10, wherein when a state which is symmetrical with respect to the RDS axis passing through a state taken as a start point by a predetermined code word exists for all states taken at even-number times from a start point to an end point by the predetermined code word, the conversion with respect to the RDS axis passing through the center point is not performed on the predetermined code word.

14. The encoding method as claimed in claim 9, wherein when a state which is symmetrical with respect to the RDS axis passing through a state taken as a start point by a predetermined code word exists for all states taken at even-number times from a start point to an end point by the predetermined code word, the conversion with respect to the ADS axis passing through the center point is all-bit inversion.

15. The encoding method as claimed in claim 10, wherein when a state which is symmetrical with respect to the ADS axis passing through a state taken as a start point by a predetermined code word exists for all states taken at even-number times from a start point to an end point by the predetermined code word, the conversion with respect to the RDS axis passing through the center point is all-bit inversion.

16. An encoding device for encoding m-bit data to an n-bit code, characterized by comprising:

encoding means for converting an input m-bit data word to an n-bit code word having as a start point a predetermined state contained in a state assembly set as start points of the code;

code word converting means for converting an n-bit code word having as a start point a predetermined state contained in a state assembly set as start points by the code supplied from said encoding means to an n-bit code word having as a start point another state contained in a state assembly set as start points of the code;

code word examining means for examining the state of the end point (end-state) of a code word and the type of the code word on the basis of the code word supplied from said encoding means;

end point state converting means for converting the state of the end point supplied from said code word examining means to the state of the end point output from said code word converting means; and storing means for storing the end-point state output from said end-point state converting means by the amount corresponding to one code word, and outputting the state of the start point of a code word which will be next output from said code word converting means.

17. A decoding method for decoding an n-bit code to m-bit data, characterized in that: the n-bit code is generated according to a finite state transition diagram representing the restriction of ADS and RDS received by a code sequence; two states contained in a state assembly set as start points of the n-bit code in the finite state transition diagram exist at symmetrical positions with respect to the center point of the finite state transition diagram, at symmetrical positions with respect to the ADS axis passing through the center point of the finite state transition diagram or at the symmetrical positions with respect to the RDS axis passing the center point of the finite state transition diagram; an n-bit code having as a start point any state contained in a state assembly set as start points of the code is converted to another n-bit code having as a start point a predetermined state contained in a state assembly set as start points of the code; and the m-bit data is obtained by decoding the converted code word.

18. The decoding method as claimed in claim 17, wherein when the maximum value and the minimum value of ADS are maximum ADS and minimum ADS respectively, the difference between the maximum ADS and the minimum ADS is set to a multiple of 2, and when the maximum value and the minimum value of RDS are maximum RDS and minimum RDS respectively, the difference between the maximum RDS and the minimum RDS is set to a multiple of 2.

19. The decoding method as claimed in claim 18, wherein when n is set to a multiple of 4, a state on the finite state transition diagram is expressed by (ADS, RDS), (minimum ADS+maximum ADS)/2 is set to center ADS, and (minimum RDS+maximum RDS)/2 is set to center RDS, a state set as a start point by the code is one of the following four states: a state (center ADS−2, center RDS−2) a state (center ADS−2, center RDS+2); a state (center ADS+2, center RDS−2); and a state (center ADS+2, center RDS+2).

20. The decoding method as claimed in claim 19, wherein m is equal to 16, and n is equal to 20.

21. The decoding method as claimed in claim 20, wherein the difference between the maximum ADS and the minimum ADS is equal to 10, and the difference between the maximum RDS and the minimum RDS is equal to 10.

22. The d encoding method as claimed in cl aim 21, wherein when the code word takes a start point at time 0, a path departing at time 0 from a state in which ADS is equal to (center ADS−2) does not arrive, at time 7, at a state in which ADS is equal to (center ADS−2) or less, and a path departing at time 0 from a state in which ADS is equal to (center ADS+2) does not arrive, at time 7, at a state in which ADS is equal to (center ADS+2) or more.

23. The decoding method as claimed in claim 21, wherein on the finite state transition diagram, the state is prohibited from departing from a state in which RDS is equal to the minimum RDS and arriving at a state in which RDS is equal to the maximum RDS through ten state transitions, and also prohibited from departing from a state in which RDS is equal to the maximum RDS and arriving at a state in which RDS is equal to the minimum RDS through ten state transitions.

24. The decoding method as claimed in claim 23, wherein conversion between code words having as start points those states which are symmetrical with each other with respect to the center point of the finite state transition diagram is performed so that each state taken from a start point to an end point by a code word before the conversion and each state taken from a start point to an end point by a code word after the conversion are located symmetrically with each other, that is, all bits of the code word are inverted.

25. The decoding method as claimed in claim 23, wherein the conversion between codes having as start points states which are located symmetrically with one another with respect to the ADS axis passing through the center point of the finite state transition diagram is performed so that respective states taken at even-number times from a start point to an end point by a code word before the conversion and respective states taken at odd-number times from a start point to an end point by a code word after the conversion are located symmetrically with each other with respect to the ADS axis passing the center point, and the respective states taken at the odd-number times by the code word after the conversion are uniquely determined on the basis of the respective states at the even-number times by the code word after the conversion, that is, so that the code word is sectioned from the bit of the start point side every 2 bits to convert "00" to "11", "01" to "01", "10" to "10" and "11" to "00".

26. The decoding method as claimed in claim 23, wherein the conversion between codes having as start points states which are located symmetrically with one another with respect to the RDS axis passing through the center point of the finite state transition diagram is performed so that respective states taken at even-number times from a start point to an end point by a code word before the conversion and respective states taken at odd-number times from a start point to an end point by a code word after the conversion are located symmetrically with each other with respect to the RDS axis passing the center point, and the respective states taken at the odd-number times by the code word after the conversion are uniquely determined on the bas is of the respective states at the even-number times by the code word after the conversion, that is, so that the code word is sectioned from the bit of the start point side every 2 bits to convert "00" to "00", "01" to "10", "10" to "01" and "11" to "11".

27. The decoding method as claimed in claim 24, wherein when a state which is symmetrical with a state taken as a start point by a predetermined code word exists for all states taken at each time from a start point to an end point by the predetermined code word, the conversion with respect to the center point is not performed on the predetermined code word.

28. The decoding method as claimed in claim 25, wherein when a state which is symmetrical with respect to the ADS axis passing through a state taken as a start point by a predetermined code word exists for all states taken at even-number times from a start point to an end point by the predetermined code word, the conversion with respect to the ADS axis passing through the center point is not performed on the predetermined code word.

29. The decoding method as claimed in claim 26, wherein when a state which is symmetrical with respect to the RDS axis passing through a state taken as a start point by a predetermined code word exists for all states taken at even-number times from a start point to an end point by the predetermined code word, the conversion with respect to the RDS axis passing through the center point is not performed on the predetermined code word.

30. The decoding method as claimed in claim 25, wherein when a state which is symmetrical with respect to the RDS axis passing through a state taken as a start point by a predetermined code word exists for all states taken at even-number times from a start point to an end point by the predetermined code word, the conversion with respect to the ADS axis passing through the center point is all-bit inversion.

31. The decoding method as claimed in claim 26, wherein when a state which is symmetrical with respect to the ADS axis passing through a state taken as a start point by a predetermined code word exists for all states taken at even-number times from a start point to an end point by the predetermined code word, the conversion with respect to the RDS axis passing through the center point is all-bit inversion.

32. A decoding device for decoding an n-bit code to m-bit data, characterized by comprising:

code word examining means for examining the state of a start point of an input n-bit code word and the type thereof;

code word converting means for converting an n-bit code word having as a start point any state contained in a state assembly set as start points of the input code to another n-bit code word having as a start point a predetermined state contained in a state assembly set as start points of the code; and decoding means for decoding a code word converted by said code word converting means to the m-bit data word.

33. A supply medium in which an n-bit code obtained by encoding m-bit data is recorded, characterized in that the n-bit code is generated according to a finite state transition diagram representing the restriction of ADS and RDS received by a code sequence; two states contained in a state assembly set as start points of the n-bit code in the finite state transition diagram exist at symmetrical positions with respect to the center point of the finite state transition diagram, at symmetrical positions with respect to the ADS axis passing through the center point of the finite state transition diagram, or at the symmetrical positions with respect to the RDS axis passing the center point of the finite state transition diagram.

* * * * *

UNITED STATES PATENT AND TRADEMARK OFFICE
CERTIFICATE OF CORRECTION

PATENT NO.    : 6,347,390 B1
DATED         : February 12, 2002
INVENTOR(S)   : Hiroyuki Ino It is certified that error appears in the above-identified patent and that said Letters Patent is hereby corrected as shown below:

Column 1,
Line 47, please add ")" after Trellis;
Line 48, delete ")" after Trellis.

Column 3,
Line 48, change "partitioning" to -- "partitioning" --.

Column 9,
Line 33, change "codewords".," to -- code words." --.

Column 10,
Line 59, change "tour" to -- four --.

Column 11,
Line 1, change "en" to -- $S_1$ --.

Column 12,
Line 19, change "satisfies" to -- satisfy --.

Column 17,
Line 1, delete ",".

Column 18,
Line 46, change "reach" to -- each --;
Lines 49 and 60, change "." to -- : --;
Lines 51 and 62, change "." to -- ; --.

Column 21,
Line 34, change "code-word" to -- code word --;
Line 38, change "code-word" to -- code word --;
Line 41, change "code-" to -- code --.

Column 22,
Line 24, change "an" to -- a --

UNITED STATES PATENT AND TRADEMARK OFFICE
CERTIFICATE OF CORRECTION

PATENT NO. : 6,347,390 B1
DATED : February 12, 2002
INVENTOR(S) : Hiroyuki Ino

It is certified that error appears in the above-identified patent and that said Letters Patent is hereby corrected as shown below:

Column 27,
Line 65, change "d encoding" to -- decoding --; same line, change "cl aim" to -- claim --.

Column 28,
Line 53, change "bas is" to -- basis --.

Signed and Sealed this

Eighteenth Day of June, 2002

*Attest:*

*Attesting Officer*

JAMES E. ROGAN
*Director of the United States Patent and Trademark Office*